(12) United States Patent
Costrini et al.

(10) Patent No.: US 9,577,068 B2
(45) Date of Patent: Feb. 21, 2017

(54) PROTECTION OF SEMICONDUCTOR-OXIDE-CONTAINING GATE DIELECTRIC DURING REPLACEMENT GATE FORMATION

(71) Applicant: International Business Machines Corporation, Armonk, NY (US)

(72) Inventors: Gregory Costrini, Hopewell Junction, NY (US); Ravikumar Ramachandran, Pleaseantville, NY (US); Reinaldo A. Vega, Wappingers Falls, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/235,935

(22) Filed: Aug. 12, 2016

(65) Prior Publication Data

US 2016/0351687 A1    Dec. 1, 2016

Related U.S. Application Data

(62) Division of application No. 14/320,760, filed on Jul. 1, 2014, now Pat. No. 9,431,395.

(51) Int. Cl.
*H01L 27/088* (2006.01)
*H01L 29/51* (2006.01)
(Continued)

(52) U.S. Cl.
CPC ... *H01L 29/66545* (2013.01); *H01L 21/30604* (2013.01); *H01L 21/31111* (2013.01);
(Continued)

(58) Field of Classification Search
CPC .......... H01L 21/3081; H01L 21/76224; H01L 21/823431; H01L 21/823462; H01L 21/823481; H01L 27/0886; H01L 29/0653; H01L 29/517; H01L 29/6681
(Continued)

(56) References Cited

U.S. PATENT DOCUMENTS 5,362,677 A    11/1994 Sakamoto et al.
5,436,201 A    7/1995 Chi et al.
(Continued)

OTHER PUBLICATIONS

BU, H. et al., "Finfet Technology, a Substrate Perspective" Presentation Made at the 2011 SOI Conference in Tempe, Arizona (Oct. 3-6, 2011) pp. 1-27, Session 7.
(Continued)

*Primary Examiner* — David Vu
*Assistant Examiner* — Jonathan Han
(74) *Attorney, Agent, or Firm* — Scully, Scott, Murphy & Presser, P.C.; Steven J. Meyers

(57) ABSTRACT

Semiconductor-oxide-containing gate dielectrics can be formed on surfaces of semiconductor fins prior to formation of a disposable gate structure. A high dielectric constant (high-k) dielectric spacer can be formed to protect each semiconductor-oxide-containing gate dielectric. Formation of the high-k dielectric spacers may be performed after formation of gate cavities by removal of disposable gate structures, or prior to formation of disposable gate structures. The high-k dielectric spacers can be used as protective layers during an anisotropic etch that vertically extends the gate cavity, and can be removed after vertical extension of the gate cavities. A subset of the semiconductor-oxide-containing gate dielectrics can be removed for formation of high-k gate dielectrics for first type devices, while another subset of the semiconductor-oxide-containing gate dielectrics can be employed as gate dielectrics for second type devices. The vertical extension of the gate cavities increases channel widths in the fin field effect transistors.

17 Claims, 37 Drawing Sheets

(51) Int. Cl.
  *H01L 21/306* (2006.01)
  *H01L 29/66* (2006.01)
  *H01L 21/311* (2006.01)
  *H01L 21/762* (2006.01)
  *H01L 21/8234* (2006.01)
  *H01L 29/06* (2006.01)

(52) U.S. Cl.
  CPC ........... *H01L 21/76224* (2013.01); *H01L 21/823431* (2013.01); *H01L 21/823462* (2013.01); *H01L 21/823481* (2013.01); *H01L 27/0886* (2013.01); *H01L 29/0653* (2013.01); *H01L 29/517* (2013.01); *H01L 29/6681* (2013.01)

(58) Field of Classification Search
  USPC .......................................... 257/401; 438/283
  See application file for complete search history.

(56) References Cited

U.S. PATENT DOCUMENTS

| | | | |
|---|---|---|---|
| 7,154,144 B2 | 12/2006 | Kim et al. | |
| 7,670,910 B2 | 3/2010 | Kim et al. | |
| 7,790,588 B2 | 9/2010 | Kim | |
| 8,188,531 B2 | 5/2012 | Kim | |
| 8,614,127 B1* | 12/2013 | Yang | H01L 29/66545 257/E21.429 |
| 2005/0020086 A1 | 1/2005 | Kim et al. | |
| 2007/0096185 A1 | 5/2007 | Kim et al. | |
| 2009/0108358 A1* | 4/2009 | Lee | H01L 29/66621 257/368 |
| 2009/0121224 A1 | 5/2009 | Kim | |
| 2009/0294800 A1* | 12/2009 | Cheng | H01L 21/82341 257/192 |
| 2010/0289077 A1 | 11/2010 | Kim | |
| 2013/0288435 A1 | 10/2013 | Kelwing et al. | |
| 2014/0117454 A1* | 5/2014 | Liu | H01L 29/6681 257/368 |

OTHER PUBLICATIONS

List of IBM Patents or Patent Applications Treated as Related, dated Aug. 12, 2016, 2 pages.

\* cited by examiner

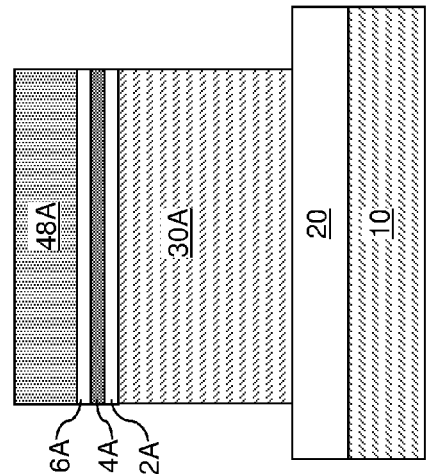
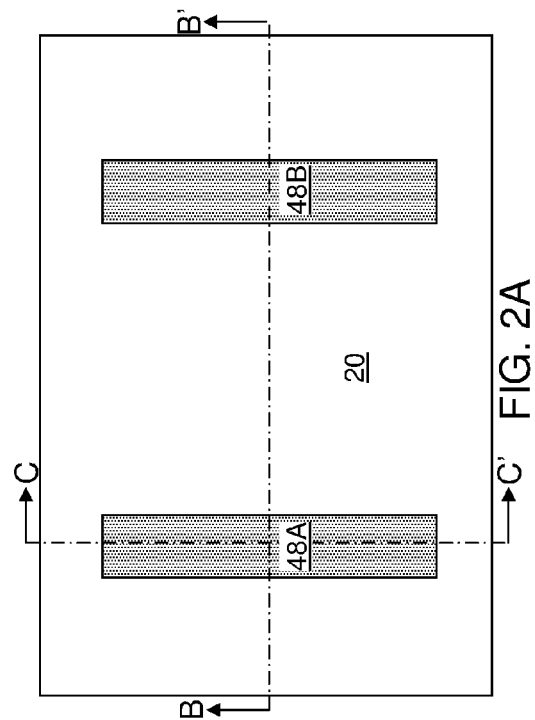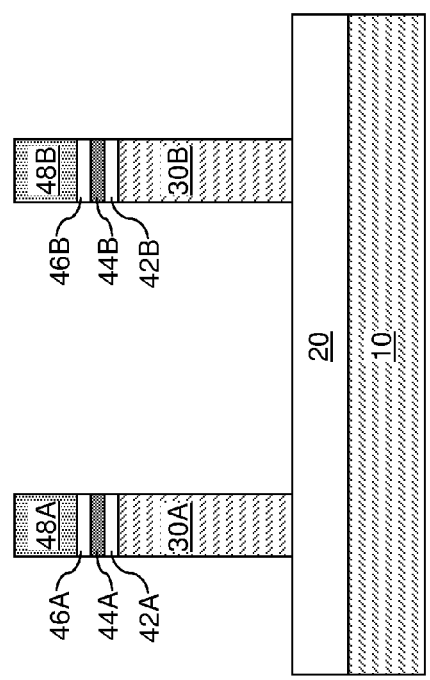

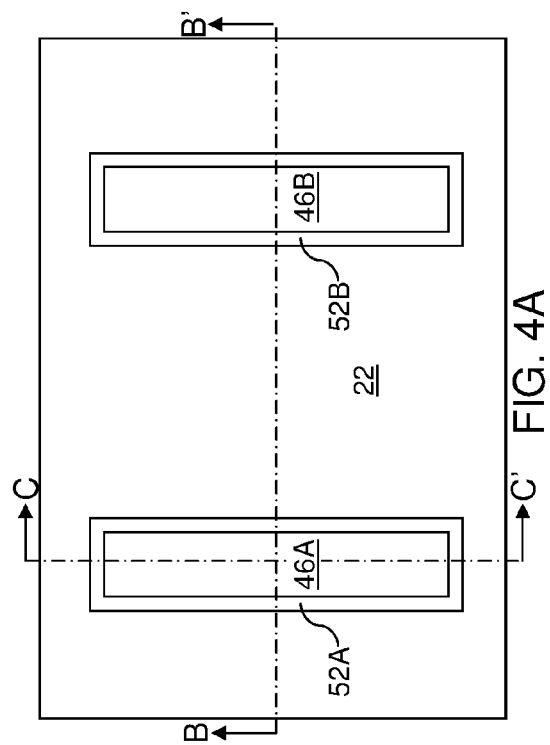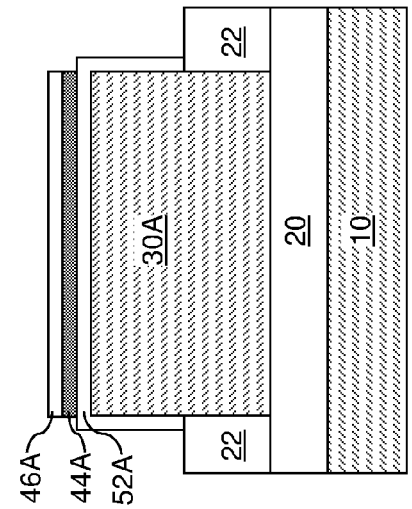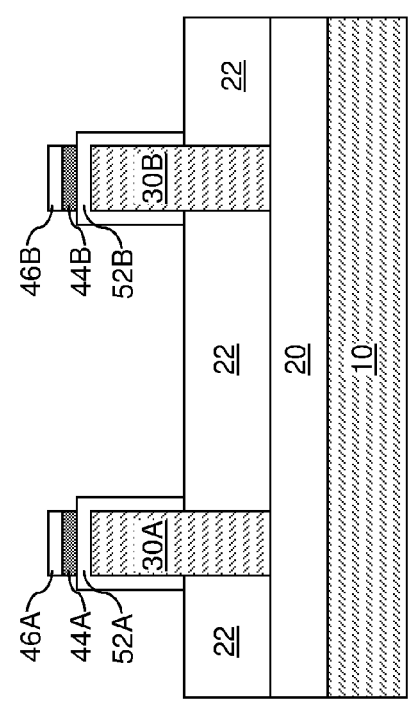

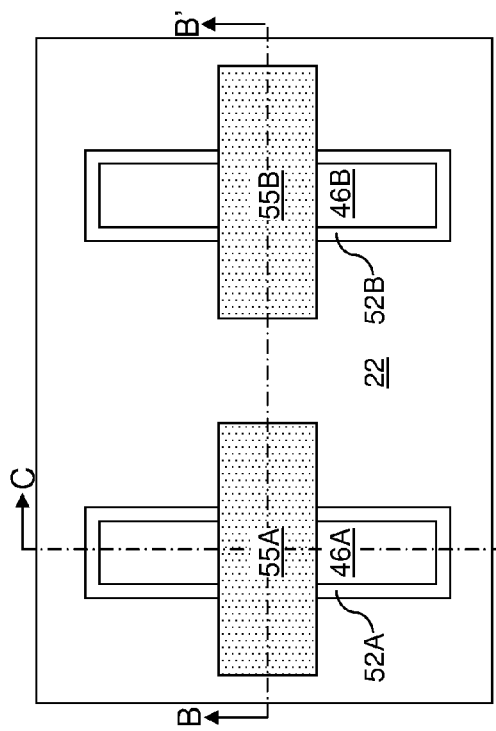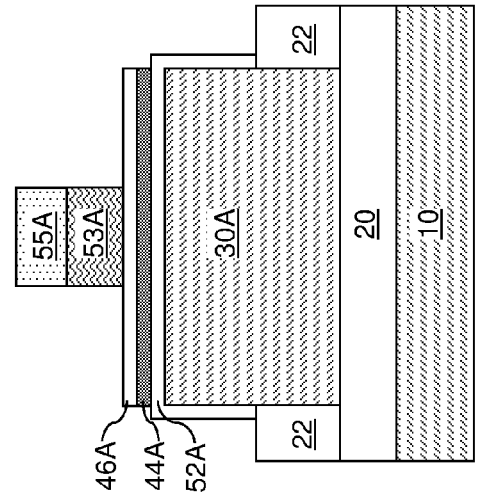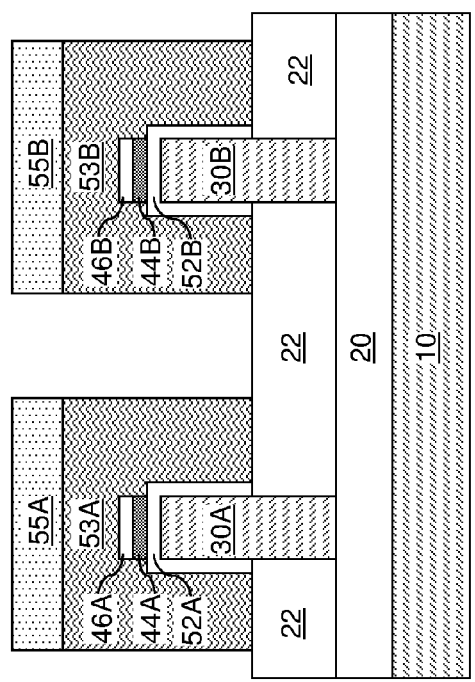

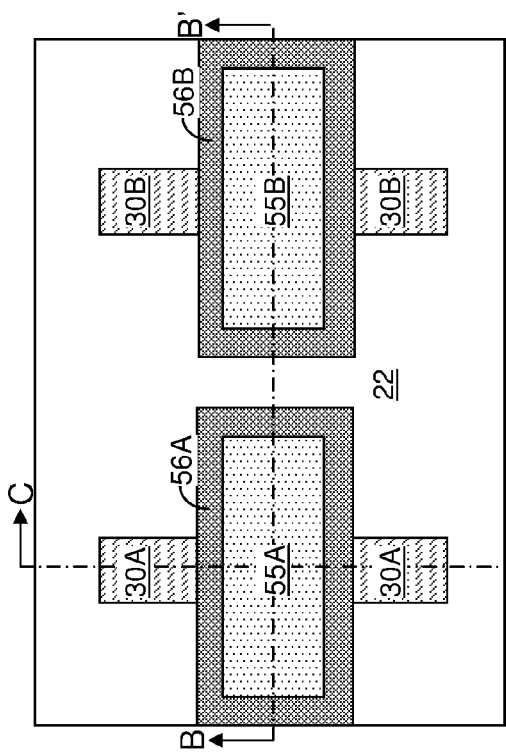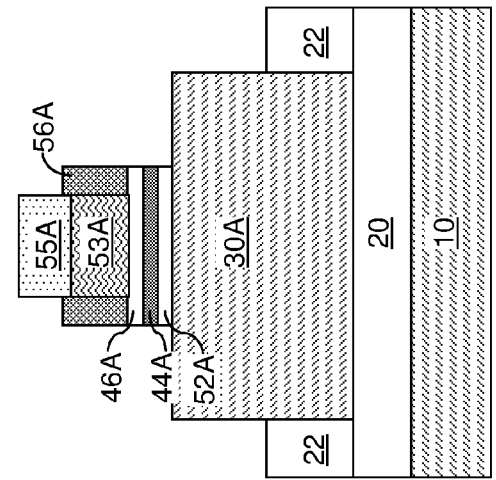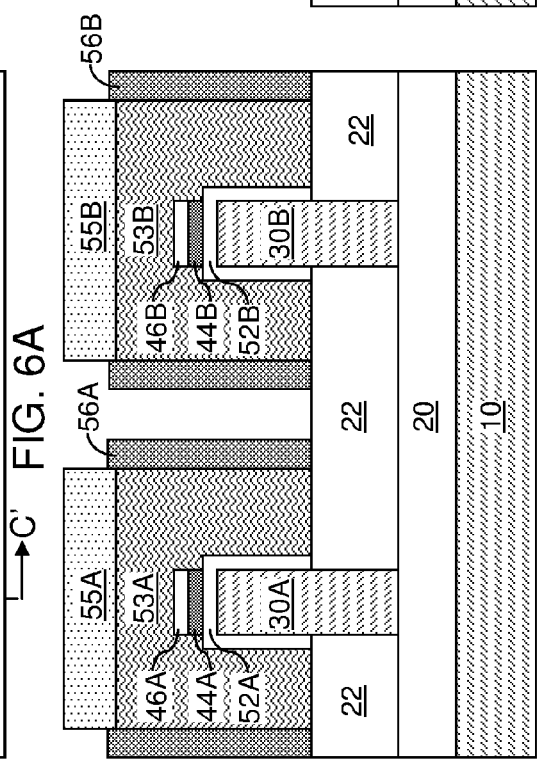

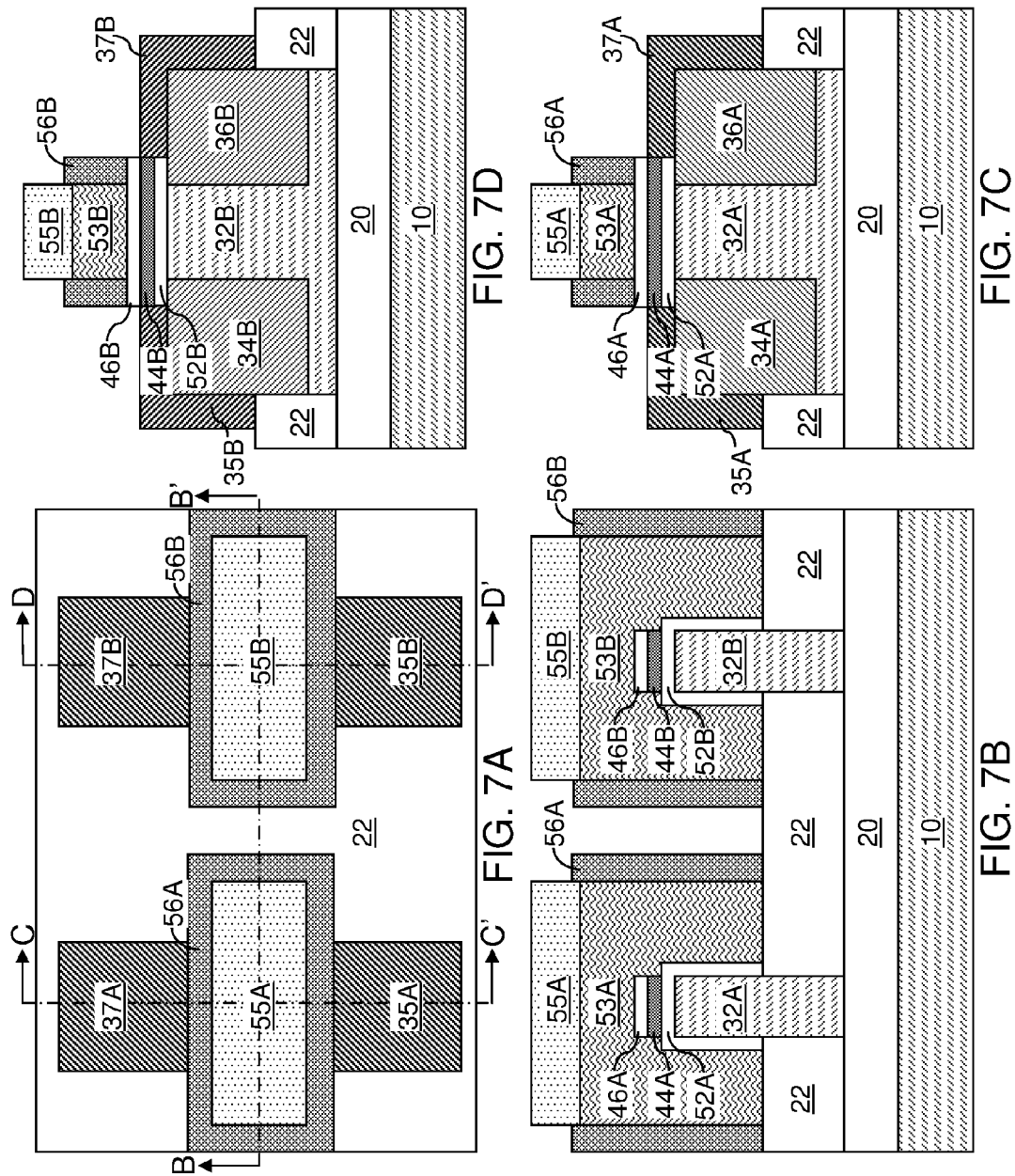

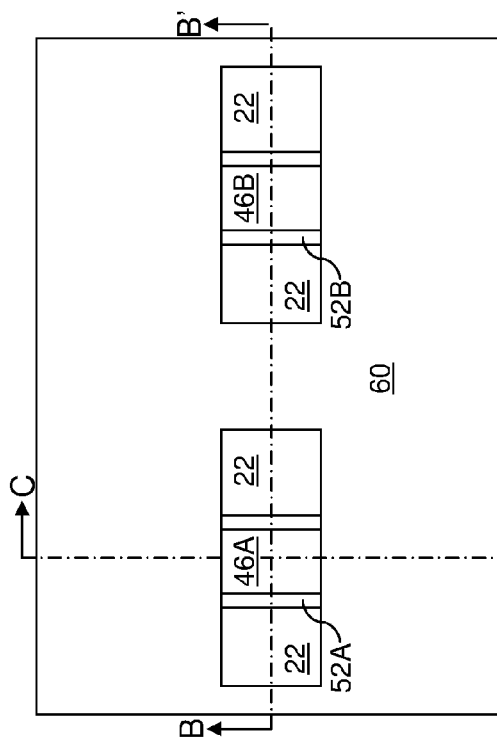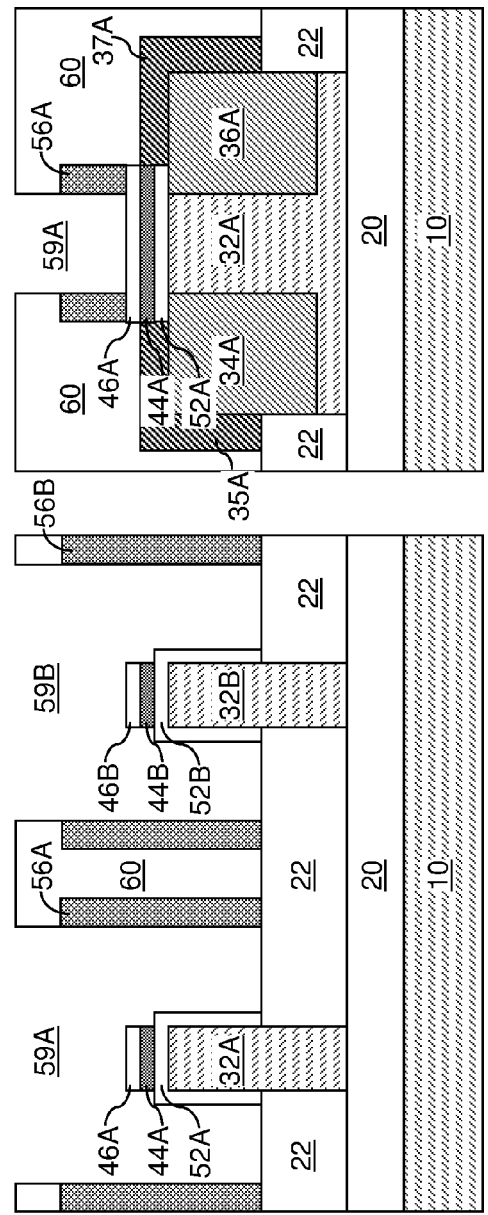
FIG. 9A
FIG. 9B
FIG. 9C

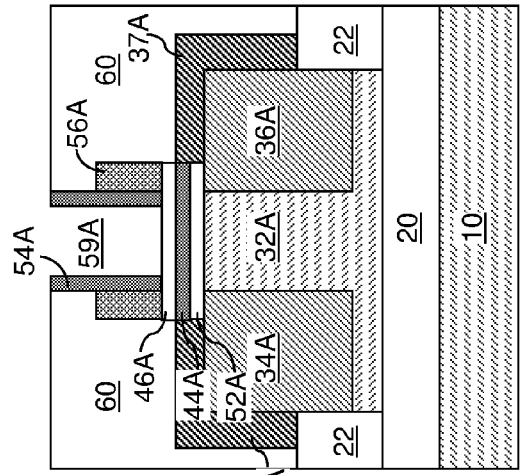
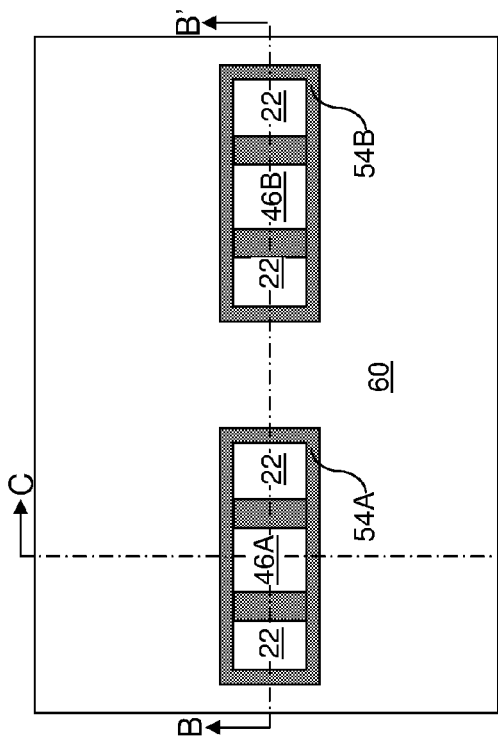
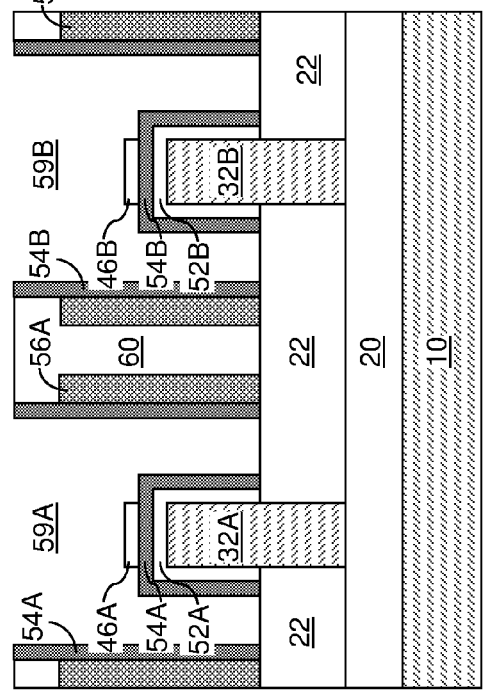

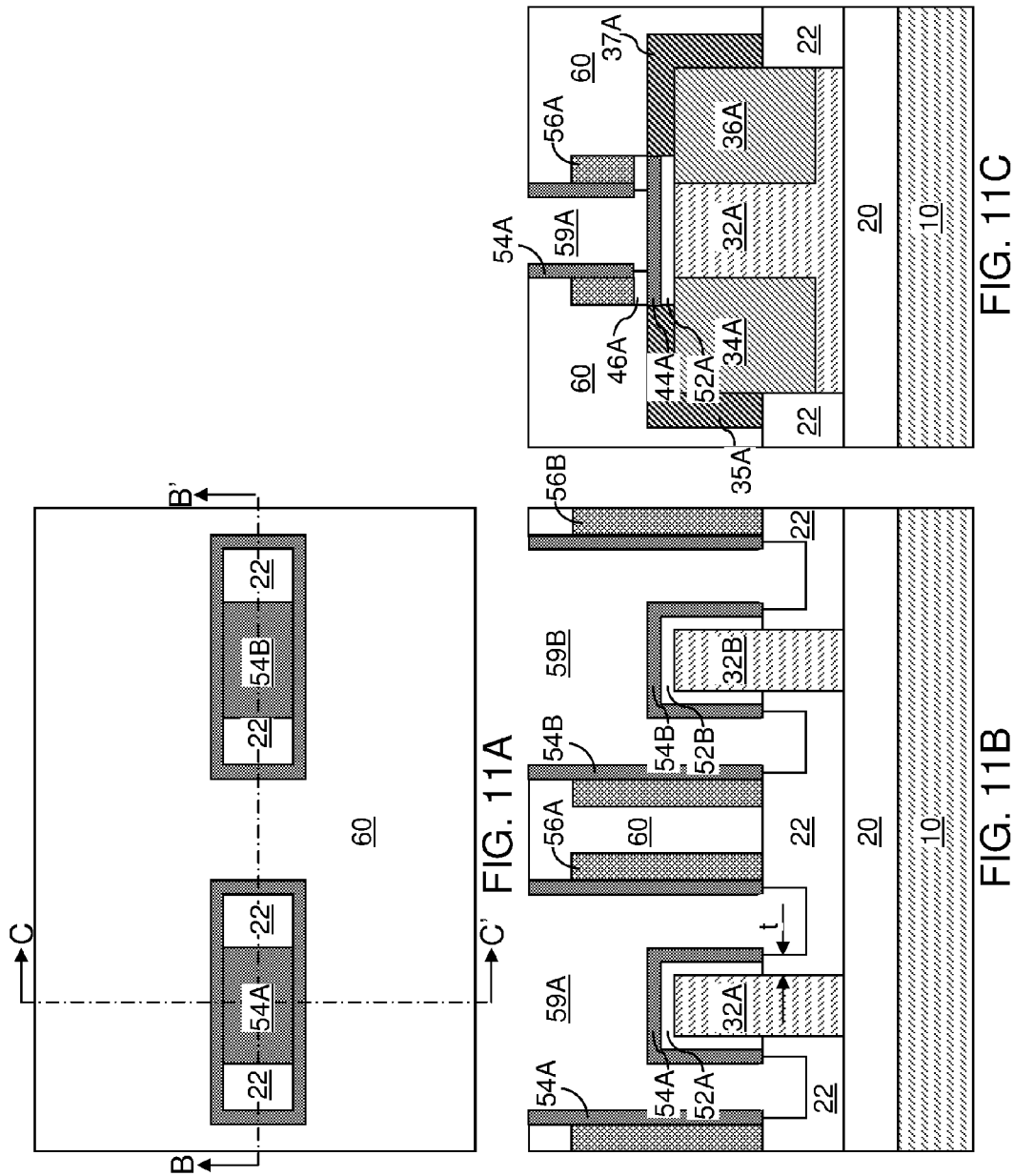

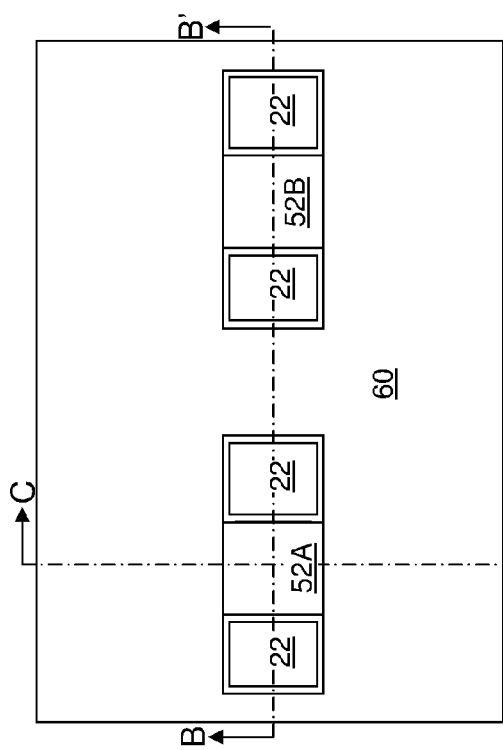
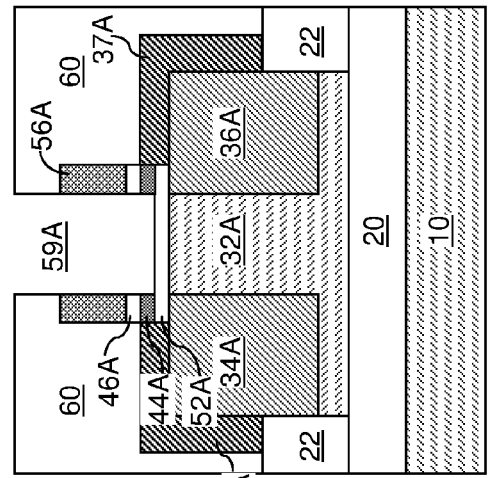
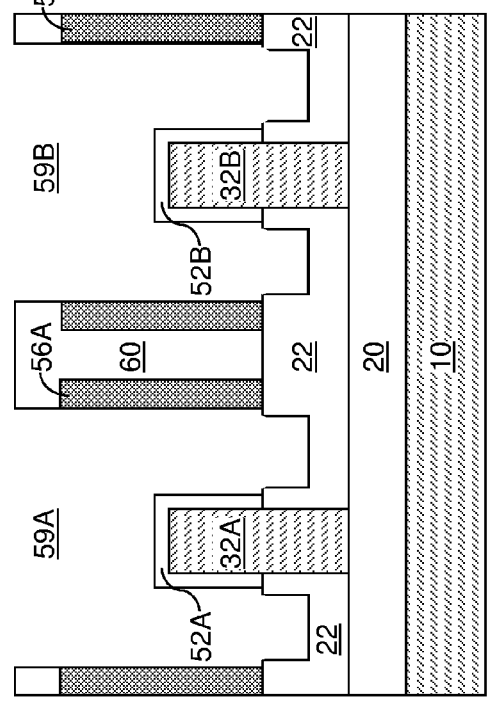
FIG. 12A
FIG. 12B
FIG. 12C

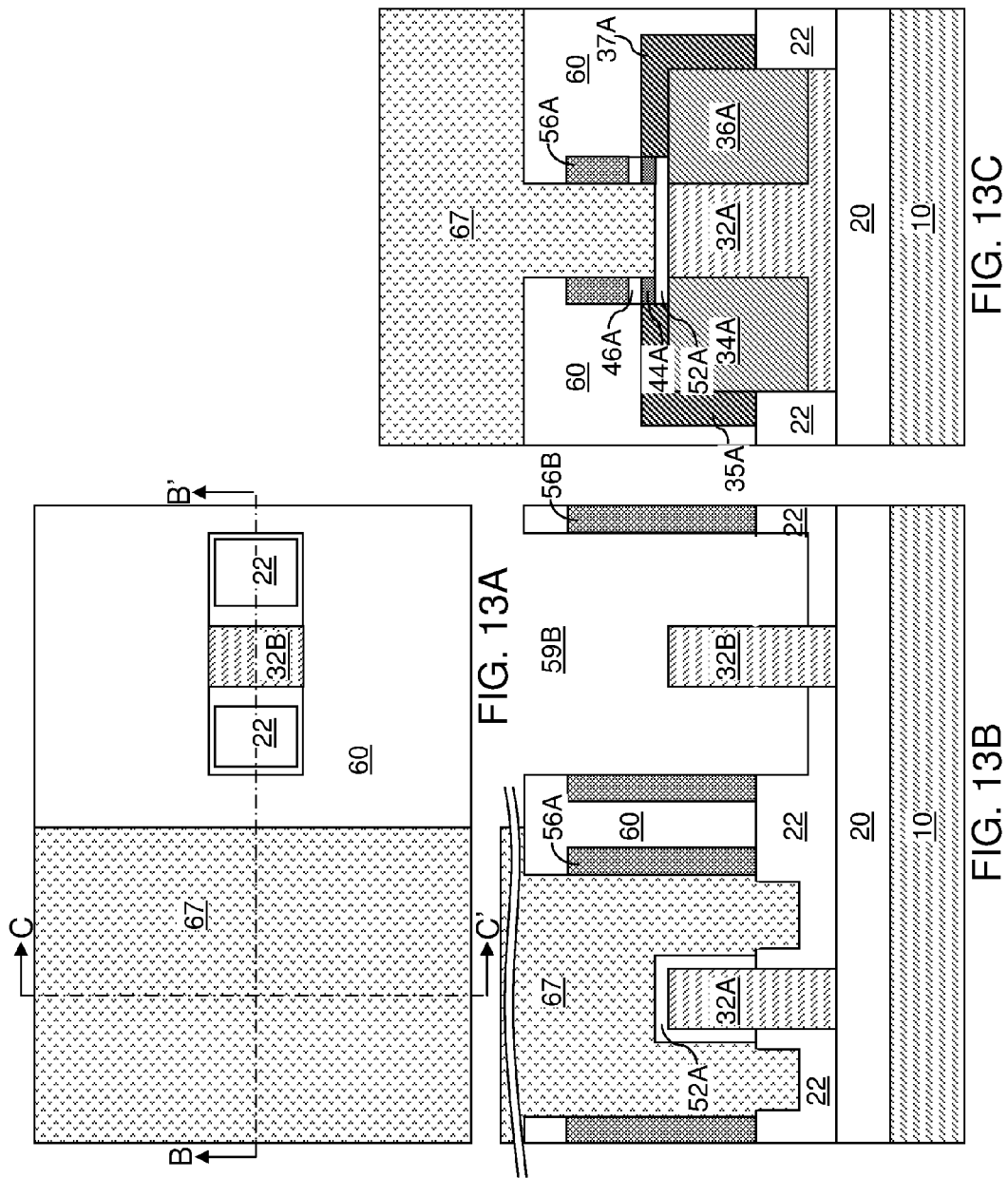

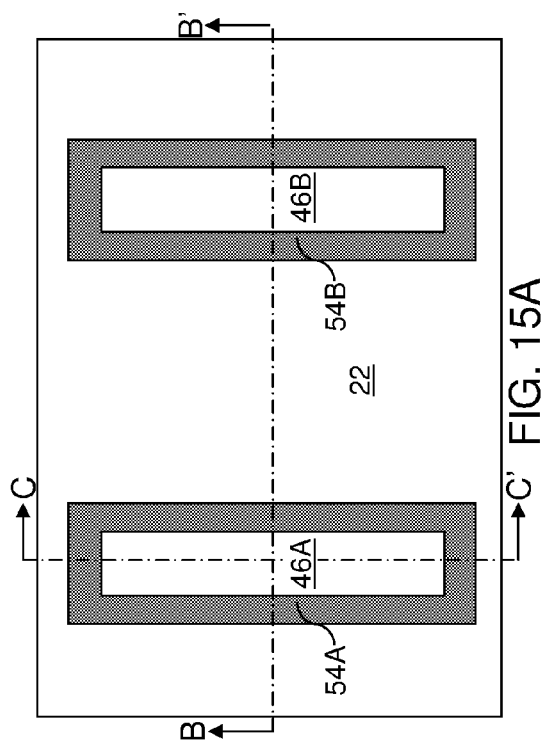
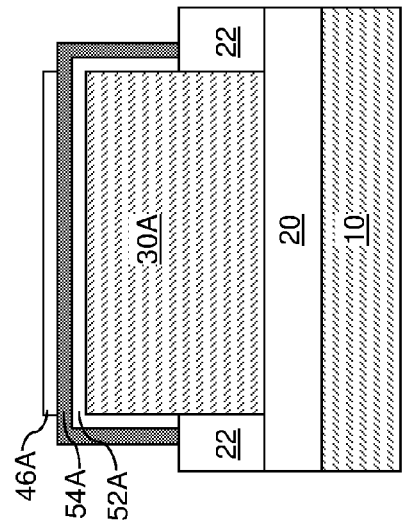
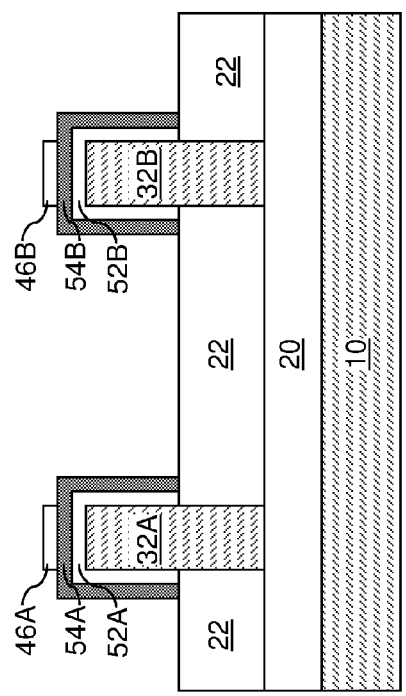

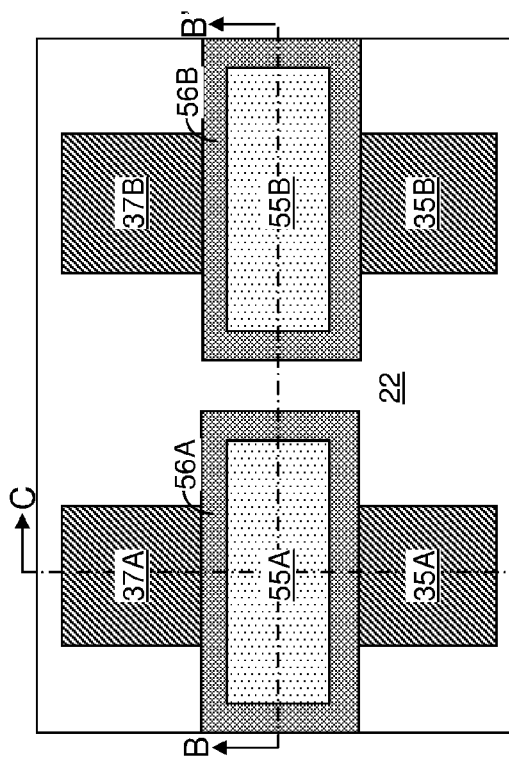
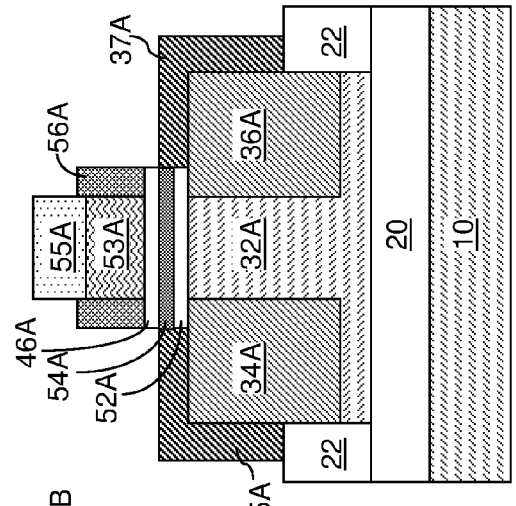
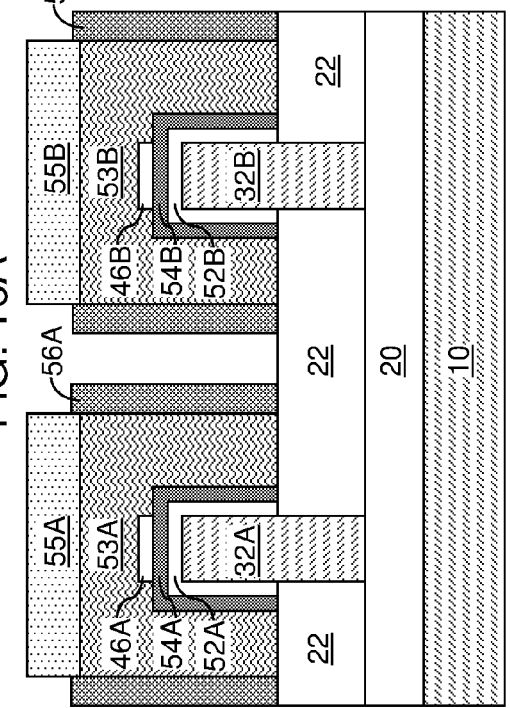
FIG. 16A
FIG. 16B
FIG. 16C

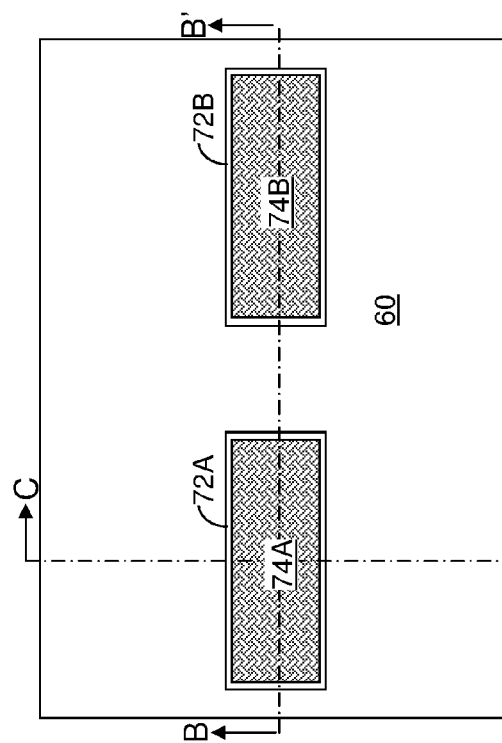
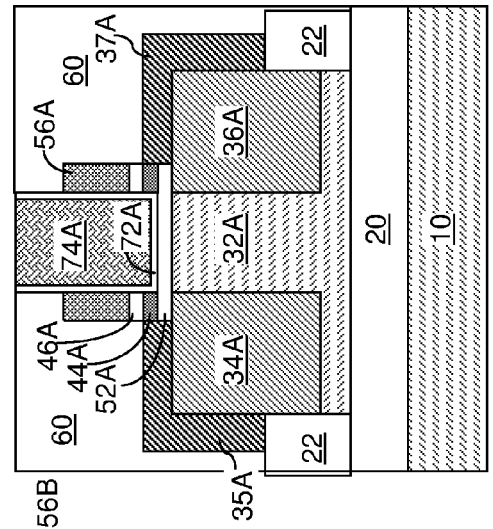
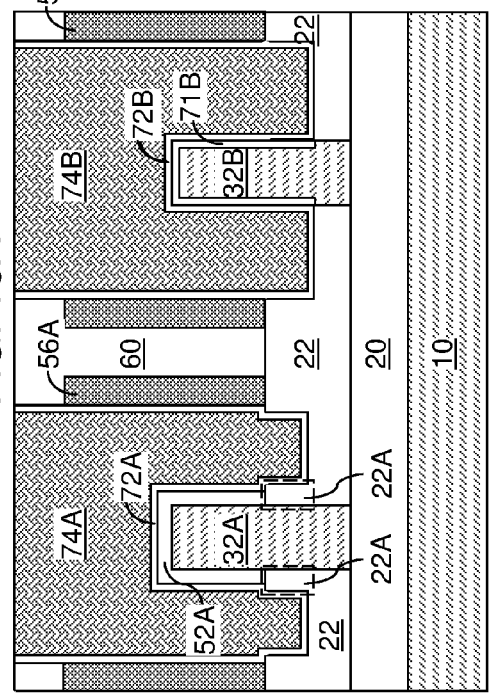

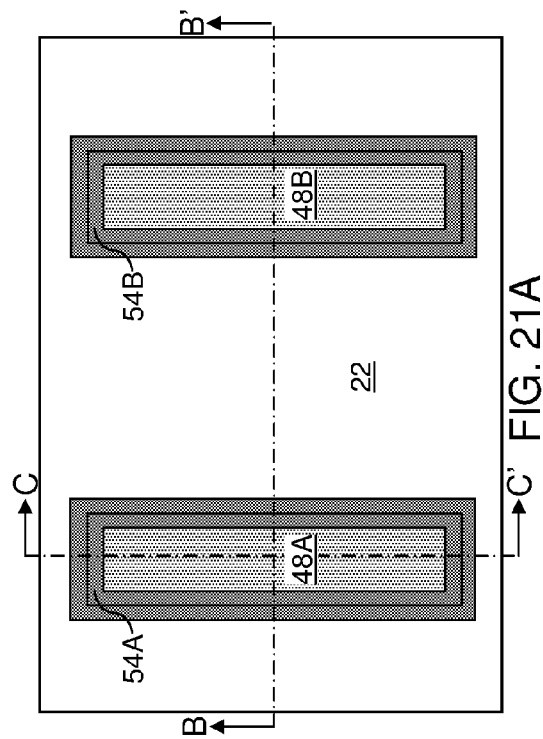
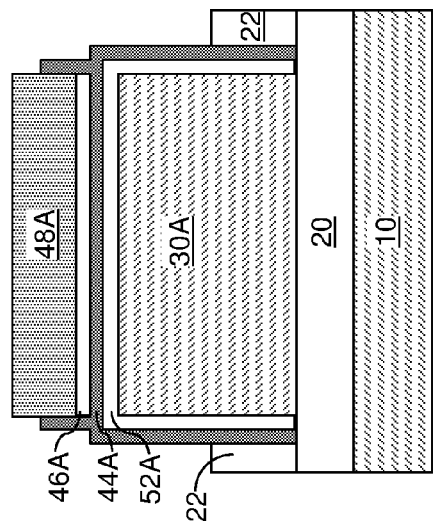
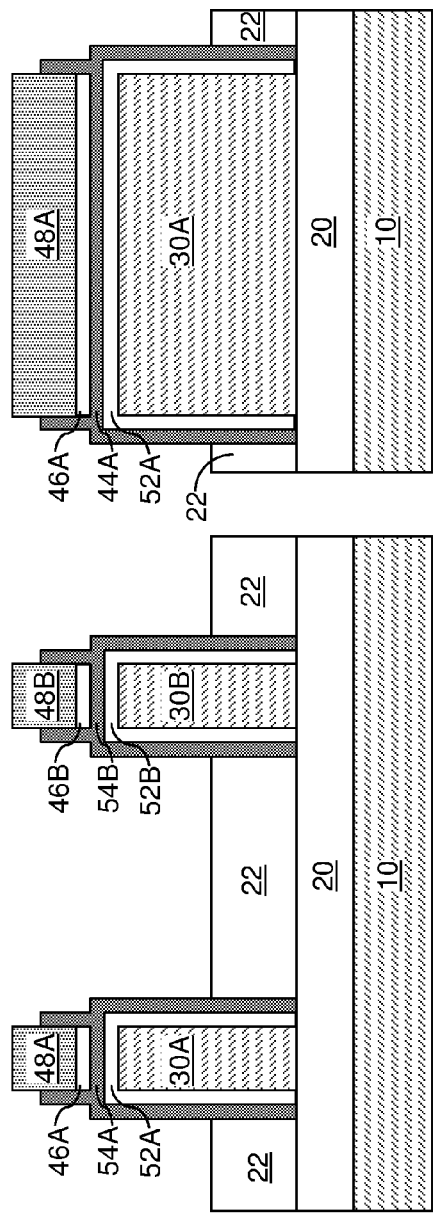

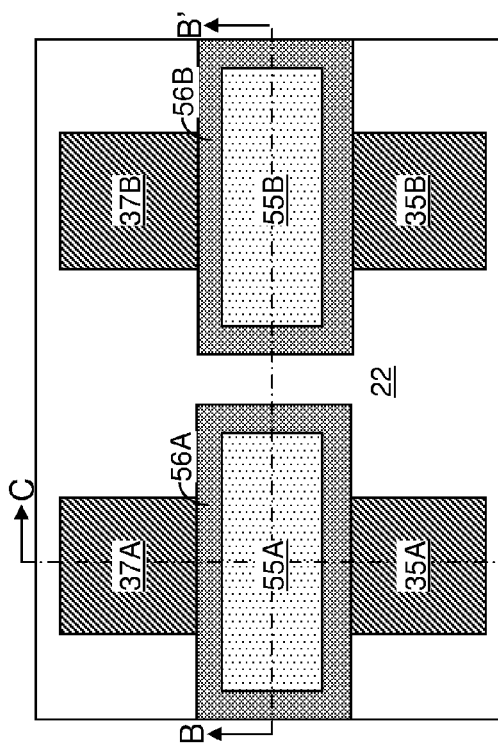
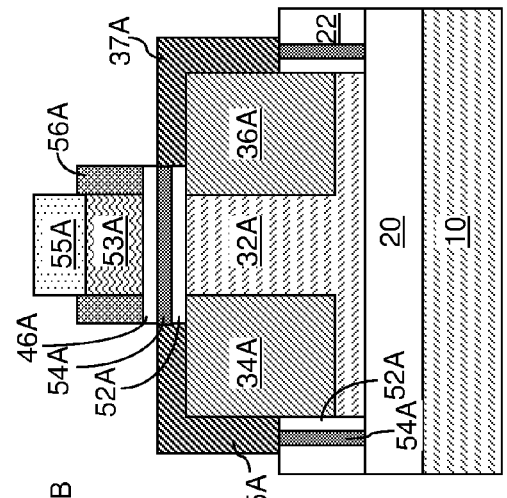
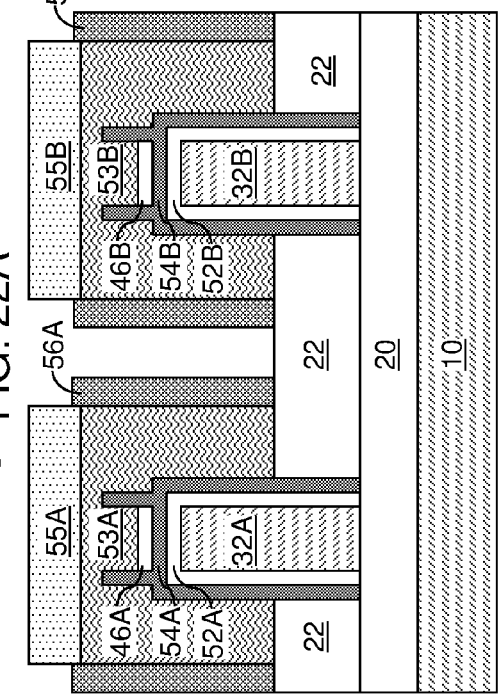
FIG. 22A
FIG. 22B
FIG. 22C

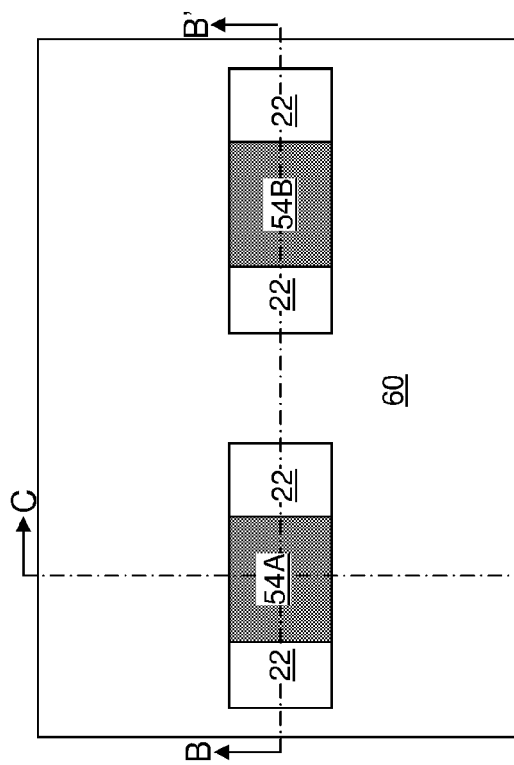
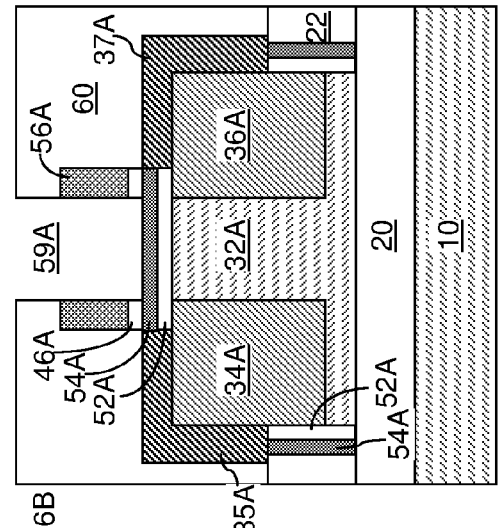
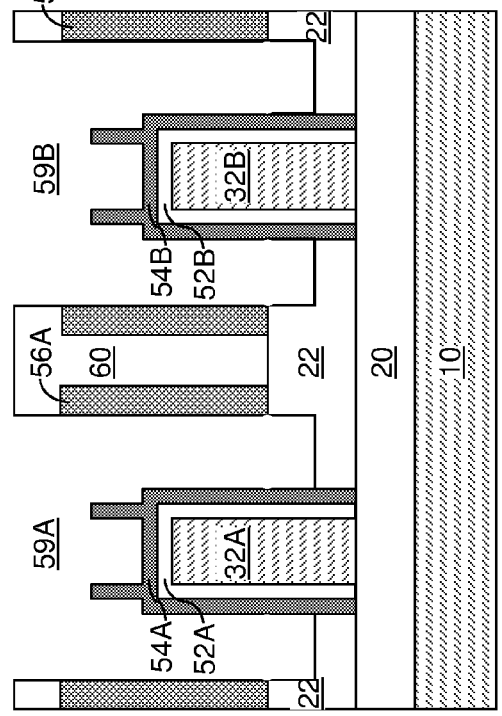
FIG. 24A
FIG. 24C
FIG. 24B

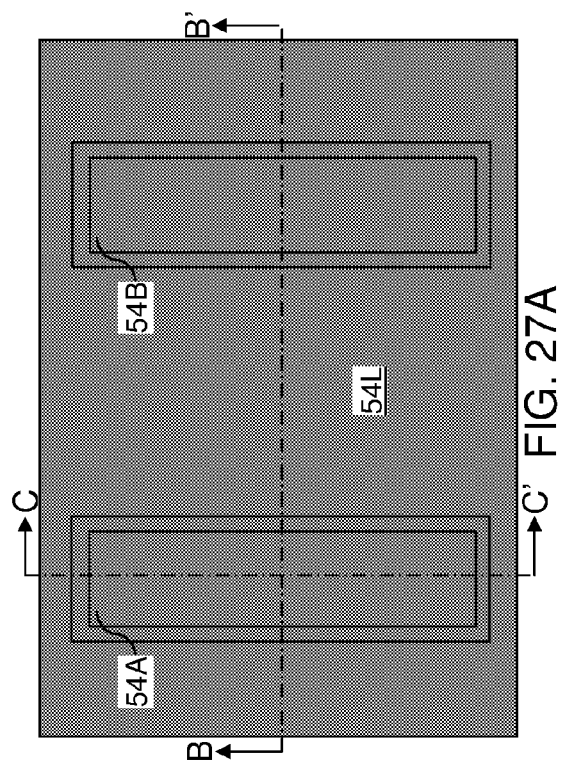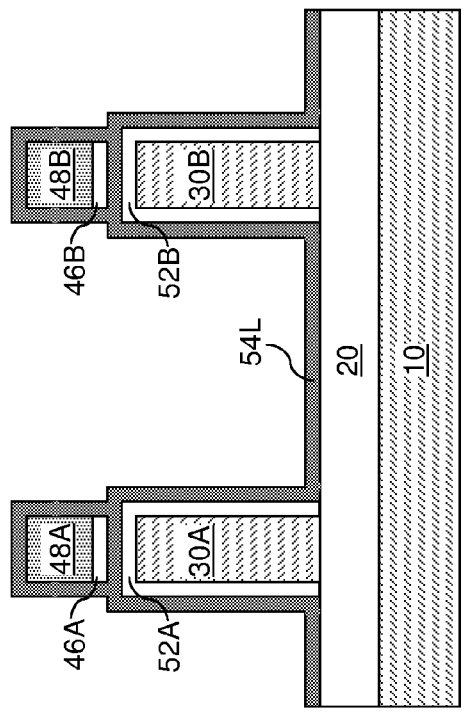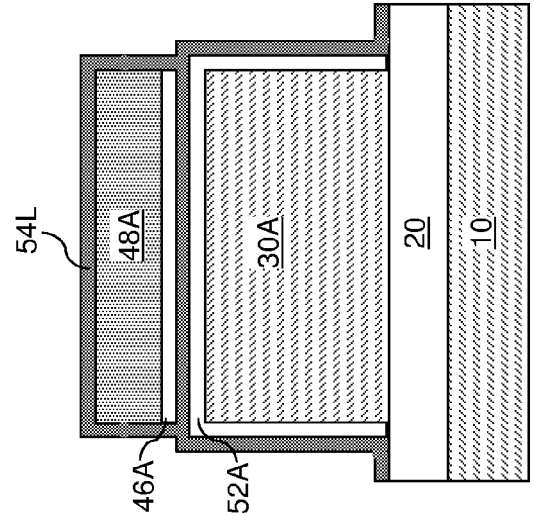

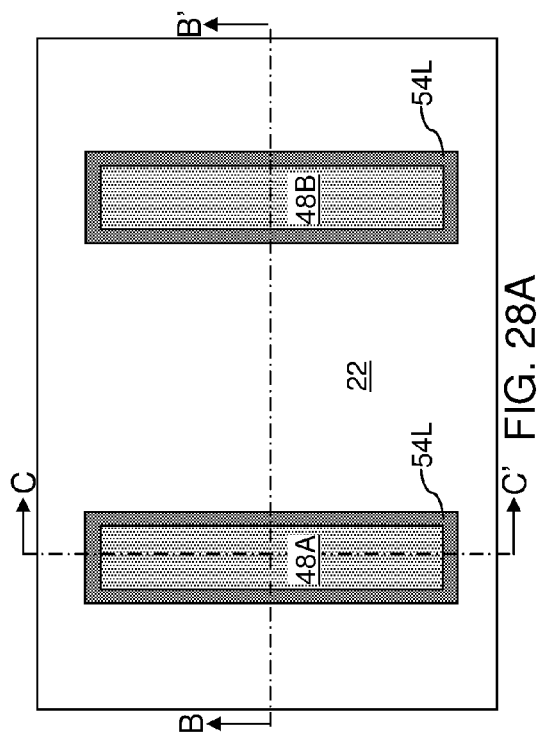
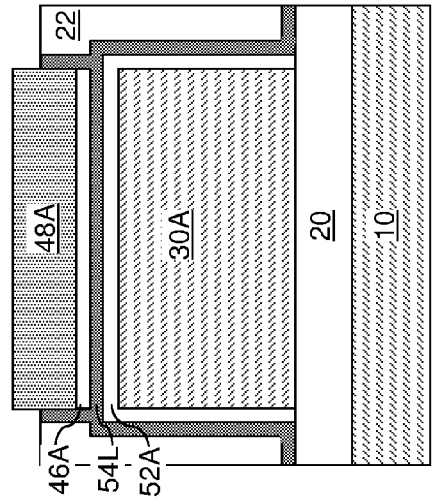
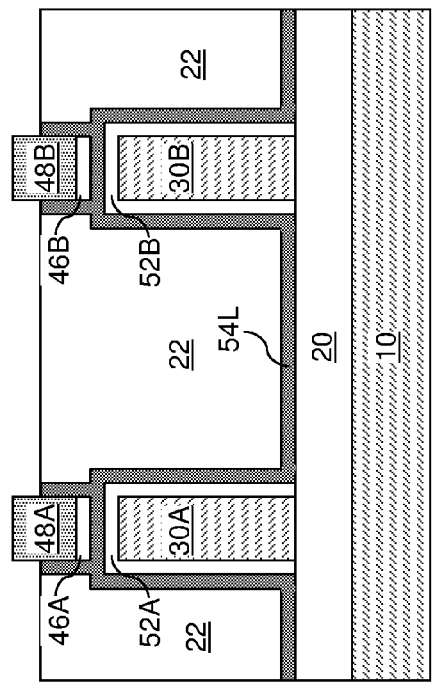
FIG. 28A
FIG. 28C
FIG. 28B

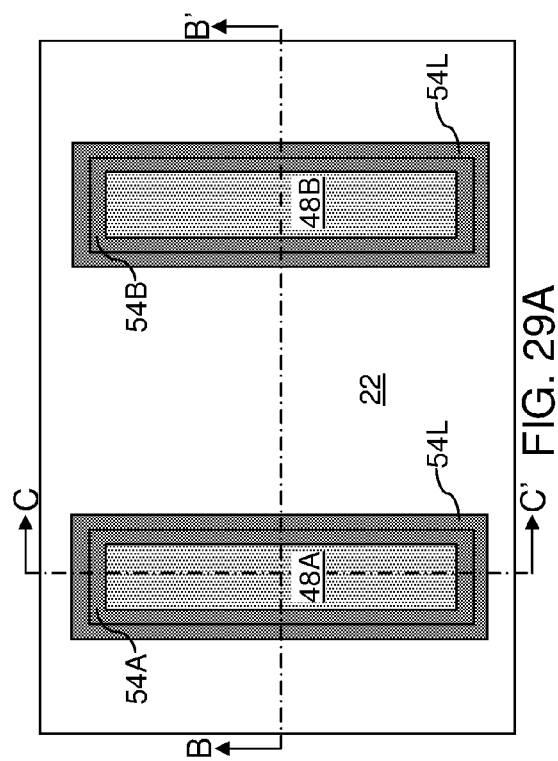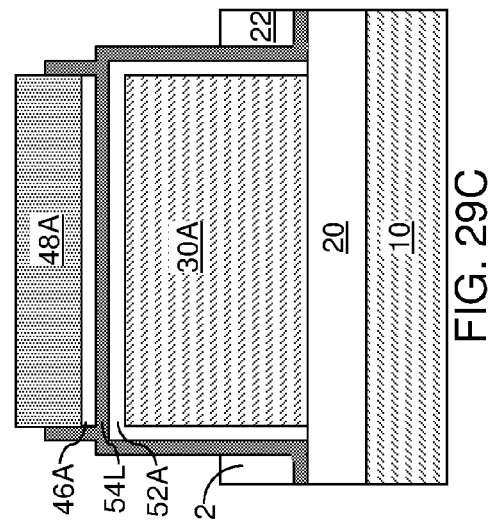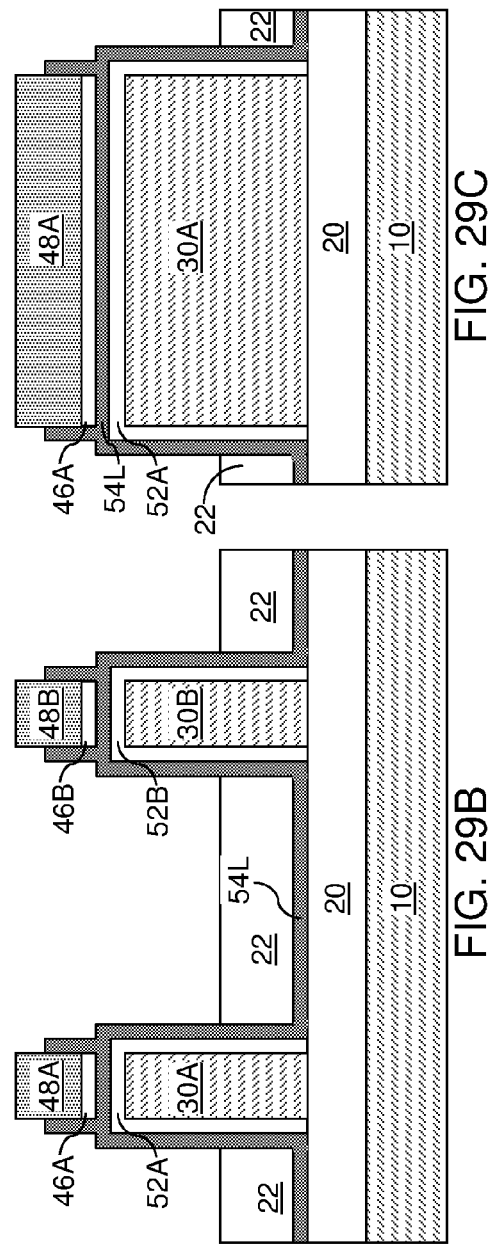

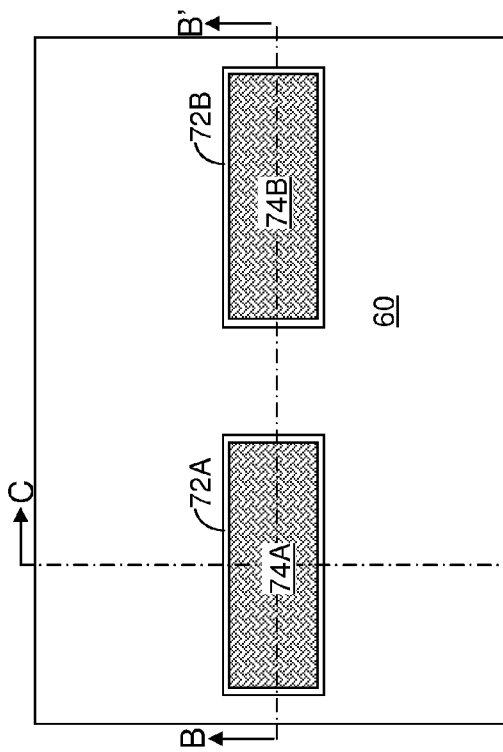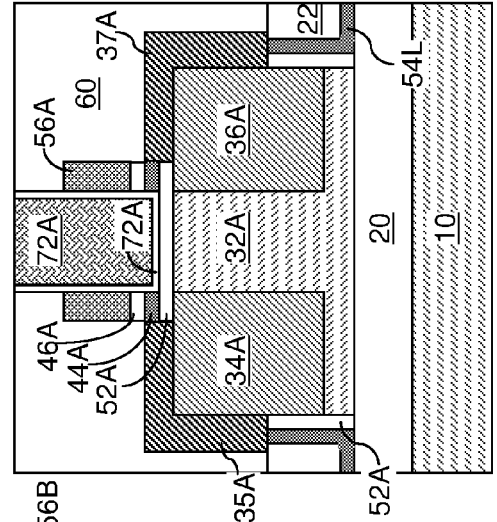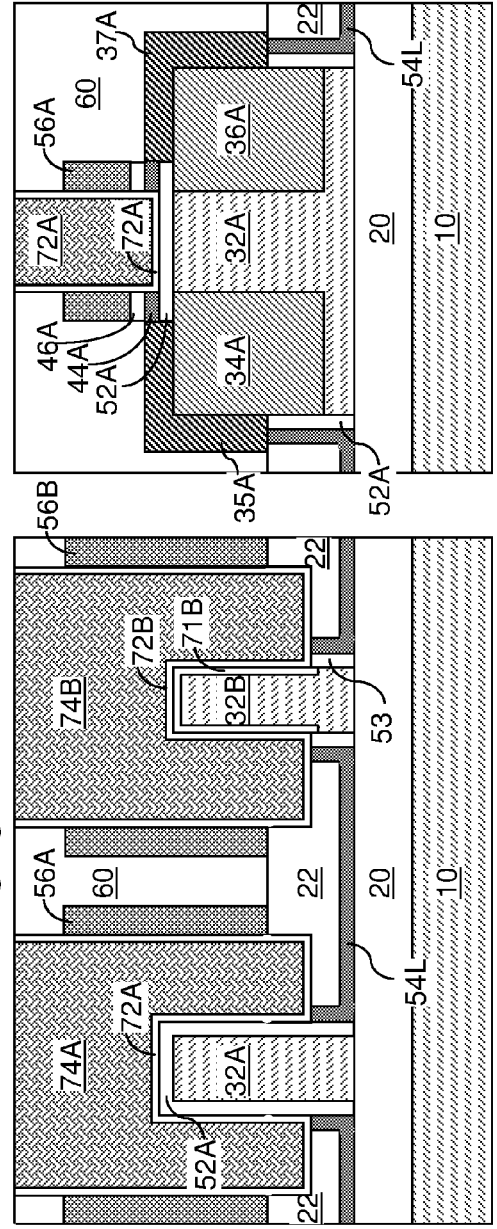

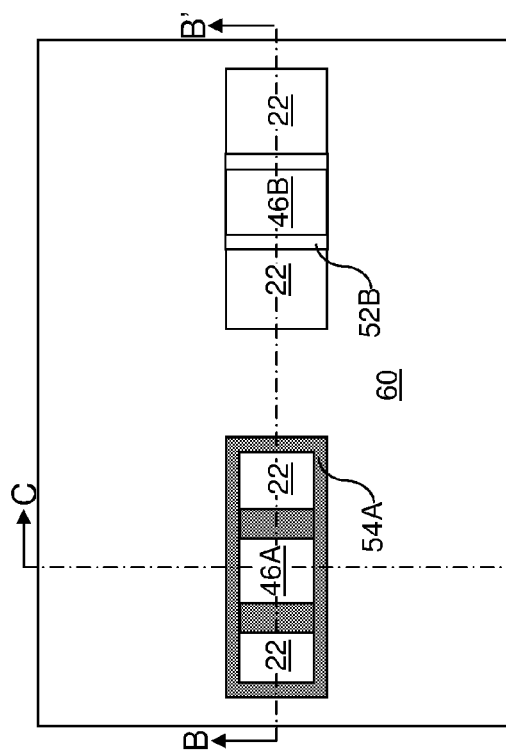
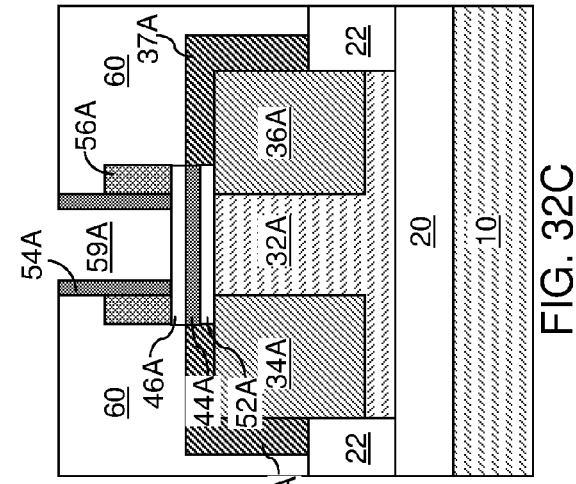
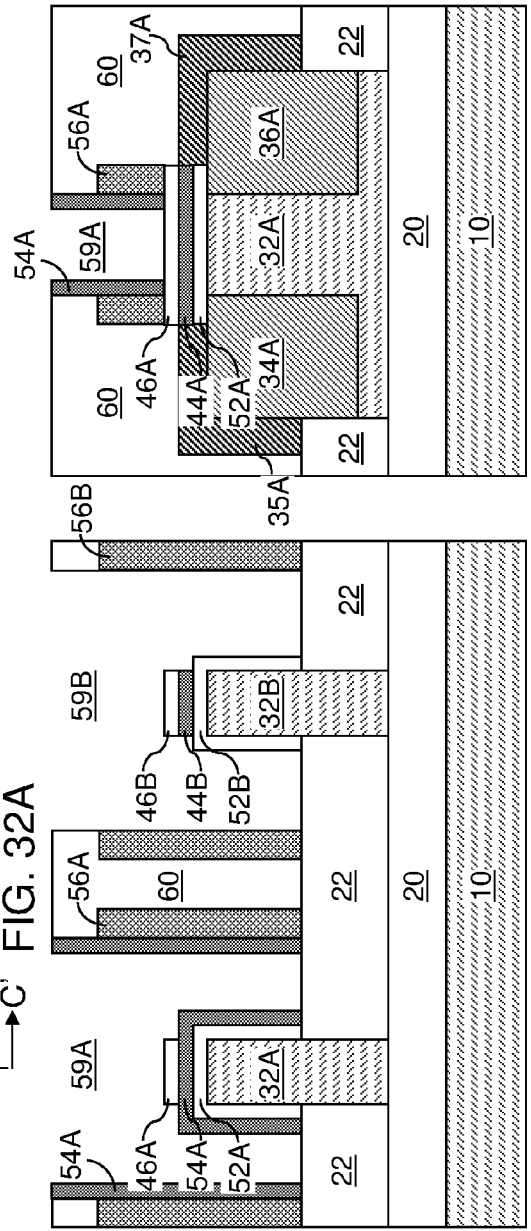
FIG. 32A
FIG. 32B
FIG. 32C

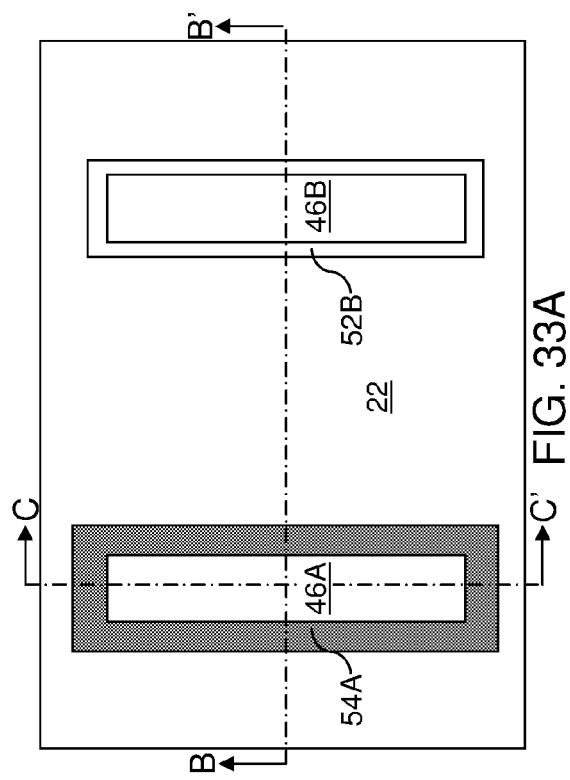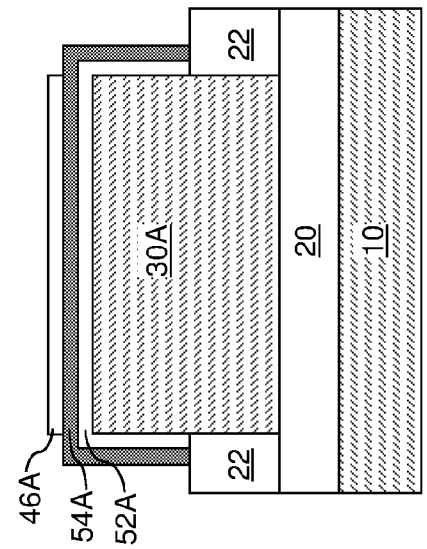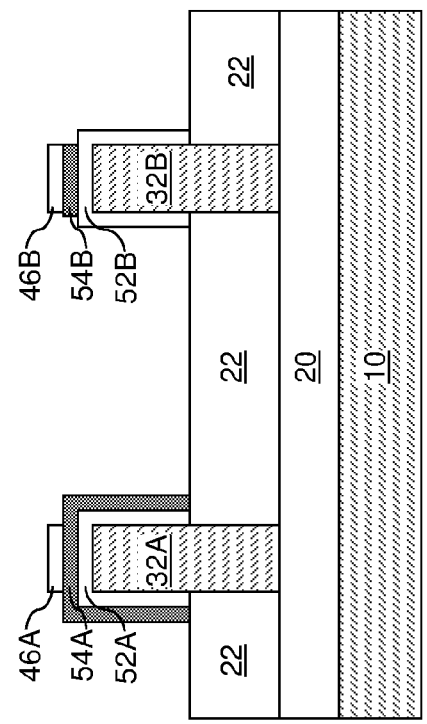

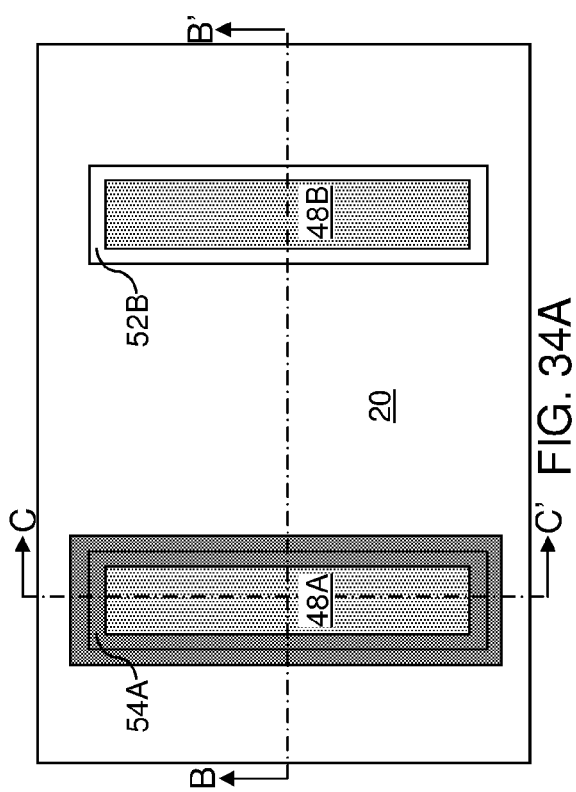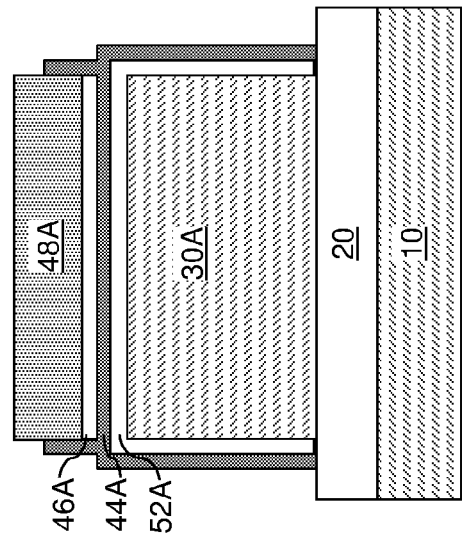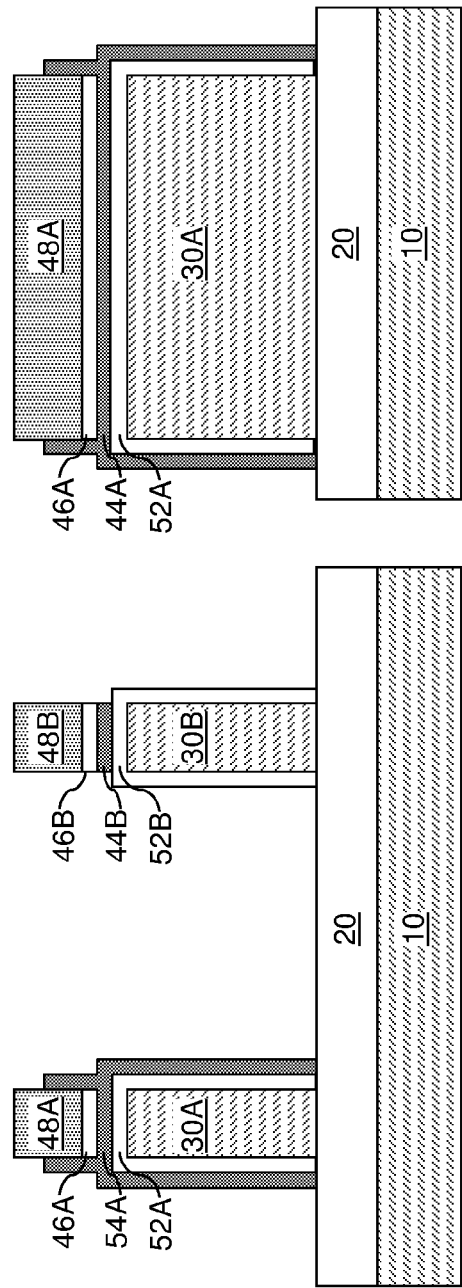

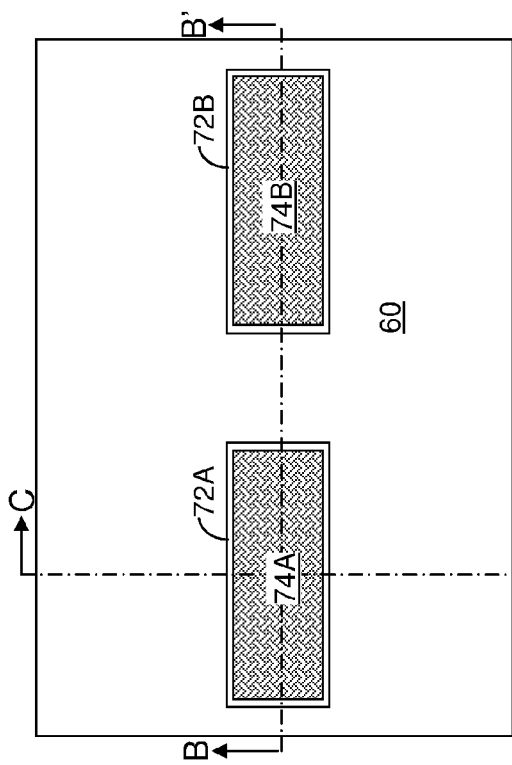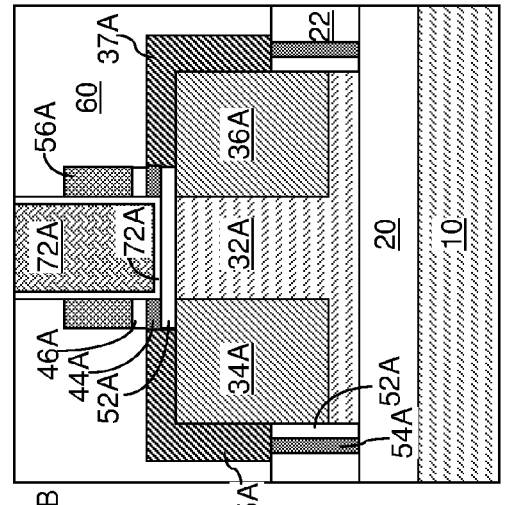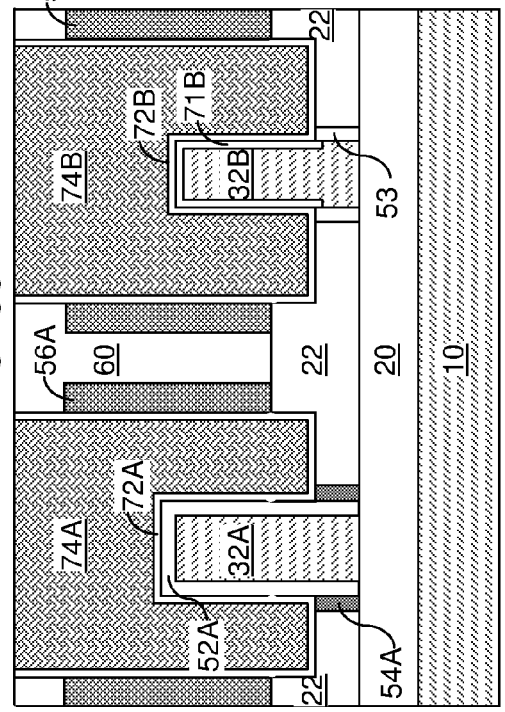
FIG. 35A
FIG. 35C
FIG. 35B

PROTECTION OF SEMICONDUCTOR-OXIDE-CONTAINING GATE DIELECTRIC DURING REPLACEMENT GATE FORMATION

BACKGROUND

The present disclosure generally relates to semiconductor structures, and particularly to semiconductor structures having a semiconductor-oxide-containing gate dielectric and a high dielectric constant (high-k) gate dielectric, and methods of manufacturing the same.

Many types of semiconductor devices can be employed in a semiconductor chip to provide various functionalities. Typically, some devices are optimized for performance, and some other devices are optimized for low power consumption. One of the methods commonly employed to provide different types of semiconductor devices is to employ multiple types of gate dielectrics. For example, a semiconductor-oxide-containing gate dielectric and a high-k gate dielectric can be employed on a same semiconductor substrate to provide different types of semiconductor devices.

A simple integration scheme for enabling semiconductor-oxide-containing gate dielectrics and high-k gate dielectrics on a same semiconductor substrate can employ a step of forming semiconductor-oxide-containing gate dielectrics prior to formation of source and drain regions in combination with a step of removing a subset of the semiconductor-oxide-containing gate dielectrics in regions where formation of high-k gate dielectrics is desired. However, this integration scheme results in damages and/or undercut to the semiconductor-oxide-containing gate dielectrics if employed in conjunction with any anisotropic etch that extends the depth of gate cavities. While extension of the gate cavities is desirable for the purpose of increasing the on-current of field effect transistors, degradation of the semiconductor-oxide-containing gate dielectrics should be avoided to maintain device performance. Thus, an integration scheme is desired for concurrently providing undamaged semiconductor-oxide-containing gate dielectrics and vertically extended gate electrodes.

SUMMARY

Semiconductor-oxide-containing gate dielectrics can be formed on surfaces of semiconductor fins prior to formation of a disposable gate structure. A high dielectric constant (high-k) dielectric spacer can be formed to protect each semiconductor-oxide-containing gate dielectric. Formation of the high-k dielectric spacers may be performed after formation of gate cavities by removal of disposable gate structures, or prior to formation of disposable gate structures. The high-k dielectric spacers can be used as protective layers during an anisotropic etch that vertically extends the gate cavity, and can be removed after vertical extension of the gate cavities. A subset of the semiconductor-oxide-containing gate dielectrics can be removed for formation of high-k gate dielectrics for first type devices, while another subset of the semiconductor-oxide-containing gate dielectrics can be employed as gate dielectrics for second type devices. The vertical extension of the gate cavities increases channel widths in the fin field effect transistors.

According to an aspect of the present disclosure, a semiconductor structure is provided, which includes a semiconductor fin located on a substrate, a shallow trench isolation layer in contact with sidewalls of a lower portion of the semiconductor fin, a semiconductor-oxide-containing gate dielectric in contact with sidewalls of an upper portion of the semiconductor fin, and a gate electrode straddling the semiconductor fin and overlying the semiconductor-oxide-containing gate dielectric. A portion of the gate electrode protrudes downward into a recess within the shallow trench isolation layer, and is laterally spaced from the lower portion of the semiconductor fin by a vertical portion of the shallow trench isolation layer.

According to another aspect of the present disclosure, another semiconductor structure is provided, which includes a semiconductor fin located on a substrate, a semiconductor-oxide-containing gate dielectric in contact with sidewalls of the semiconductor fin and a top surface of the substrate, a high dielectric constant dielectric liner having a dielectric constant greater than 8.0 and contacting, and laterally surrounding, a lower portion of the semiconductor-oxide-containing gate dielectric, a shallow trench isolation layer laterally surrounding a portion of the high dielectric constant dielectric liner, and a gate electrode straddling the semiconductor fin and overlying the semiconductor-oxide-containing gate dielectric and the high dielectric constant dielectric liner. A portion of the gate electrode protrudes downward into a recess within the shallow trench isolation layer.

According to yet another aspect of the present disclosure, a method of forming a semiconductor structure is provided. A semiconductor fin is formed on a substrate. A semiconductor-oxide-containing gate dielectric is formed on at least a portion of sidewalls of the semiconductor fin. A high dielectric constant dielectric liner having a dielectric constant greater than 8.0 is formed directly on at least sidewalls of the semiconductor-oxide-containing gate dielectric. A shallow trench isolation layer is formed such that a top surface of the shallow trench isolation layer is formed between a top surface and a bottom surface of the semiconductor fin. A portion of the shallow trench isolation layer is recessed employing at least the high dielectric constant dielectric liner as an etch mask. Sidewalls of the semiconductor-oxide-containing gate dielectric are physically exposed by removing at least an upper portion of the high dielectric constant dielectric liner. A high dielectric constant gate dielectric having a dielectric constant greater than 8.0 is formed directly on the sidewalls of the semiconductor-oxide-containing gate dielectric.

BRIEF DESCRIPTION OF THE SEVERAL VIEWS OF THE DRAWINGS

FIG. 2A is a top-down view of the first exemplary semiconductor structure after patterning of semiconductor fins according to the first embodiment of the present disclosure.

FIG. 2B is a vertical cross-sectional view of the first exemplary semiconductor structure along the vertical plane B-B' in FIG. 2A.

FIG. 2C is a vertical cross-sectional view of the first exemplary semiconductor structure along the vertical plane C-C' in FIG. 2A.

FIG. 4A is a top-down view of the first exemplary semiconductor structure after formation of semiconductor-oxide-containing gate dielectrics according to the first embodiment of the present disclosure.

FIG. 4B is a vertical cross-sectional view of the first exemplary semiconductor structure along the vertical plane B-B' in FIG. 4A.

FIG. 4C is a vertical cross-sectional view of the first exemplary semiconductor structure along the vertical plane C-C' in FIG. 4A.

FIG. 5A is a top-down view of the first exemplary semiconductor structure after formation of disposable gate structures according to the first embodiment of the present disclosure.

FIG. 5B is a vertical cross-sectional view of the first exemplary semiconductor structure along the vertical plane B-B' in FIG. 5A.

FIG. 5C is a vertical cross-sectional view of the first exemplary semiconductor structure along the vertical plane C-C' in FIG. 5A.

FIG. 6A is a top-down view of the first exemplary semiconductor structure after formation of gate spacers according to the first embodiment of the present disclosure.

FIG. 6B is a vertical cross-sectional view of the first exemplary semiconductor structure along the vertical plane B-B' in FIG. 6A.

FIG. 6C is a vertical cross-sectional view of the first exemplary semiconductor structure along the vertical plane C-C' in FIG. 6A.

FIG. 7A is a top-down view of the first exemplary semiconductor structure after formation of source regions, drain regions, raised source regions, and raised drain regions according to the first embodiment of the present disclosure.

FIG. 7B is a vertical cross-sectional view of the first exemplary semiconductor structure along the vertical plane B-B' in FIG. 7A.

FIG. 7C is a vertical cross-sectional view of the first exemplary semiconductor structure along the vertical plane C-C' in FIG. 7A.

FIG. 7D is a vertical cross-sectional view of the first exemplary semiconductor structure along the vertical plane D-D' in FIG. 7A.

FIG. 9A is a top-down view of the first exemplary semiconductor structure after formation of gate cavities according to the first embodiment of the present disclosure.

FIG. 9B is a vertical cross-sectional view of the first exemplary semiconductor structure along the vertical plane B-B' in FIG. 9A.

FIG. 9C is a vertical cross-sectional view of the first exemplary semiconductor structure along the vertical plane C-C' in FIG. 9A.

FIG. 10A is a top-down view of the first exemplary semiconductor structure after formation of high dielectric constant (high-k) dielectric liners according to the first embodiment of the present disclosure.

FIG. 10B is a vertical cross-sectional view of the first exemplary semiconductor structure along the vertical plane B-B' in FIG. 10A.

FIG. 10C is a vertical cross-sectional view of the first exemplary semiconductor structure along the vertical plane C-C' in FIG. 10A.

FIG. 11A is a top-down view of the first exemplary semiconductor structure after vertical extension of gate cavities by recessing of portions of the shallow trench isolation layer according to the first embodiment of the present disclosure.

FIG. 11B is a vertical cross-sectional view of the first exemplary semiconductor structure along the vertical plane B-B' in FIG. 11A.

FIG. 11C is a vertical cross-sectional view of the first exemplary semiconductor structure along the vertical plane C-C' in FIG. 11A.

FIG. 12A is a top-down view of the first exemplary semiconductor structure after removal of high-k dielectric liners according to the first embodiment of the present disclosure.

FIG. 12B is a vertical cross-sectional view of the first exemplary semiconductor structure along the vertical plane B-B' in FIG. 12A.

FIG. 12C is a vertical cross-sectional view of the first exemplary semiconductor structure along the vertical plane C-C' in FIG. 12A.

FIG. 13A is a top-down view of the first exemplary semiconductor structure after removal of a semiconductor-oxide-containing gate dielectric according to the first embodiment of the present disclosure.

FIG. 13B is a vertical cross-sectional view of the first exemplary semiconductor structure along the vertical plane B-B' in FIG. 13A.

FIG. 13C is a vertical cross-sectional view of the first exemplary semiconductor structure along the vertical plane C-C' in FIG. 13A.

FIG. 15A is a top-down view of a second exemplary semiconductor structure after formation of high-k dielectric liners according to a second embodiment of the present disclosure.

FIG. 15B is a vertical cross-sectional view of the second exemplary semiconductor structure along the vertical plane B-B' in FIG. 15A.

FIG. 15C is a vertical cross-sectional view of the first exemplary semiconductor structure along the vertical plane C-C' in FIG. 15A.

FIG. 16A is a top-down view of the second exemplary semiconductor structure after formation of disposable gate structures, gate spacers, source regions, drain regions, raised source regions, and raised drain regions according to the second embodiment of the present disclosure.

FIG. 16B is a vertical cross-sectional view of the second exemplary semiconductor structure along the vertical plane B-B' in FIG. 16A.

FIG. 16C is a vertical cross-sectional view of the second exemplary semiconductor structure along the vertical plane C-C' in FIG. 16A.

FIG. 18A is a top-down view of the second exemplary semiconductor structure after formation of replacement gate electrodes according to the second embodiment of the present disclosure.

FIG. 18B is a vertical cross-sectional view of the second exemplary semiconductor structure along the vertical plane B-B' in FIG. 18A.

FIG. 18C is a vertical cross-sectional view of the second exemplary semiconductor structure along the vertical plane C-C' in FIG. 18A.

FIG. 21A is a top-down view of the third exemplary semiconductor structure after formation of a shallow trench isolation layer according to the third embodiment of the present disclosure.

FIG. 21B is a vertical cross-sectional view of the third exemplary semiconductor structure along the vertical plane B-B' in FIG. 21A.

FIG. 21C is a vertical cross-sectional view of the third exemplary semiconductor structure along the vertical plane C-C' in FIG. 21A.

FIG. 22A is a top-down view of the third exemplary semiconductor structure after formation of disposable gate structures, gate spacers, source regions, drain regions, raised source regions, and raised drain regions according to the third embodiment of the present disclosure.

FIG. 22B is a vertical cross-sectional view of the third exemplary semiconductor structure along the vertical plane B-B' in FIG. 22A.

FIG. 22C is a vertical cross-sectional view of the third exemplary semiconductor structure along the vertical plane C-C' in FIG. 22A.

FIG. 24A is a top-down view of the third exemplary semiconductor structure after vertical extension of gate cavities by recessing of portions of the shallow trench isolation layer according to the third embodiment of the present disclosure.

FIG. 24B is a vertical cross-sectional view of the third exemplary semiconductor structure along the vertical plane B-B' in FIG. 24A.

FIG. 24C is a vertical cross-sectional view of the third exemplary semiconductor structure along the vertical plane C-C' in FIG. 24A.

FIG. 27A is a top-down view of a fourth exemplary semiconductor structure after removal of a contiguous high-k dielectric liner according to a fourth embodiment of the present disclosure.

FIG. 27B is a vertical cross-sectional view of the fourth exemplary semiconductor structure along the vertical plane B-B' in FIG. 27A.

FIG. 27C is a vertical cross-sectional view of the fourth exemplary semiconductor structure along the vertical plane C-C' in FIG. 27A.

FIG. 28A is a top-down view of the fourth exemplary semiconductor structure after formation and recessing of a shallow trench isolation layer and physically exposed portions of the contiguous high-k dielectric liner according to the fourth embodiment of the present disclosure.

FIG. 28B is a vertical cross-sectional view of the fourth exemplary semiconductor structure along the vertical plane B-B' in FIG. 28A.

FIG. 28C is a vertical cross-sectional view of the fourth exemplary semiconductor structure along the vertical plane C-C' in FIG. 28A.

FIG. 29A is a top-down view of the fourth exemplary semiconductor structure after further recessing of the shallow trench isolation layer according to the fourth embodiment of the present disclosure.

FIG. 29B is a vertical cross-sectional view of the fourth exemplary semiconductor structure along the vertical plane B-B' in FIG. 29A.

FIG. 29C is a vertical cross-sectional view of the fourth exemplary semiconductor structure along the vertical plane C-C' in FIG. 29A.

FIG. 31A is a top-down view of the fourth exemplary semiconductor structure after formation of replacement gate structures according to the fourth embodiment of the present disclosure.

FIG. 31B is a vertical cross-sectional view of the fourth exemplary semiconductor structure along the vertical plane B-B' in FIG. 31A.

FIG. 31C is a vertical cross-sectional view of the fourth exemplary semiconductor structure along the vertical plane C-C' in FIG. 31A.

FIG. 32A is a top-down view of a variation of the first exemplary semiconductor structure after selective removal of a second high-k dielectric liner according to the first embodiment of the present disclosure.

FIG. 32B is a vertical cross-sectional view of the variation of the first exemplary semiconductor structure along the vertical plane B-B' in FIG. 32A.

FIG. 32C is a vertical cross-sectional view of the variation of the exemplary semiconductor structure along the vertical plane C-C' in FIG. 32A.

FIG. 33A is a top-down view of a variation of the second exemplary semiconductor structure after selective removal of a second high-k dielectric liner according to the second embodiment of the present disclosure.

FIG. 33B is a vertical cross-sectional view of the variation of the second exemplary semiconductor structure along the vertical plane B-B' in FIG. 33A.

FIG. 33C is a vertical cross-sectional view of the variation of the exemplary semiconductor structure along the vertical plane C-C' in FIG. 33A.

FIG. 34A is a top-down view of a variation of the third exemplary semiconductor structure after selective removal of a second high-k dielectric liner according to the third embodiment of the present disclosure.

FIG. 34B is a vertical cross-sectional view of the variation of the third exemplary semiconductor structure along the vertical plane B-B' in FIG. 34A.

FIG. 34C is a vertical cross-sectional view of the variation of the exemplary semiconductor structure along the vertical plane C-C' in FIG. 34A.

FIG. 35A is a top-down view of a variation of the third exemplary semiconductor structure after formation of gate electrodes according to the third embodiment of the present disclosure.

FIG. 35B is a vertical cross-sectional view of the variation of the third exemplary semiconductor structure along the vertical plane B-B' in FIG. 35A.

FIG. 35C is a vertical cross-sectional view of the variation of the exemplary semiconductor structure along the vertical plane C-C' in FIG. 35A.

DETAILED DESCRIPTION

Figure 1A:
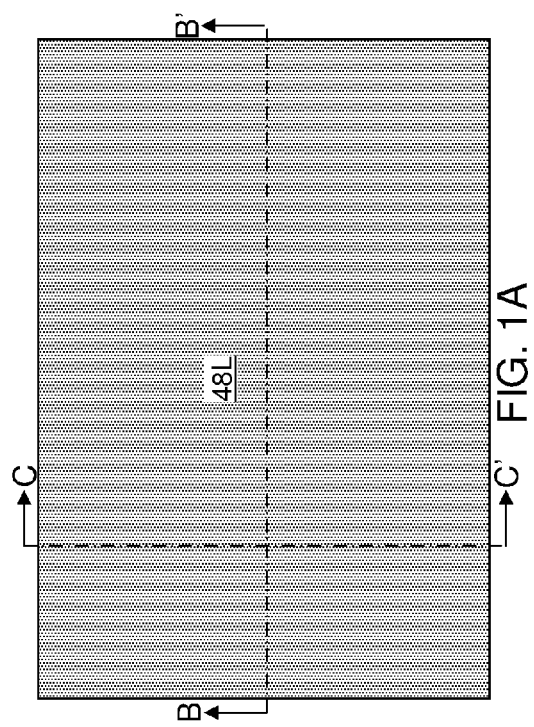
FIG. 1A is a top-down view of a first exemplary semiconductor structure after formation of pad layers and a hard mask layer on a semiconductor substrate according to a first embodiment of the present disclosure.

As stated above, the present disclosure relates to semiconductor structures having a semiconductor-oxide-containing gate dielectric and a high dielectric constant (high-k) gate dielectric, and methods of manufacturing the same. Aspects of the present disclosure are now described in detail with accompanying figures Like and corresponding elements mentioned herein and illustrated in the drawings are referred to by like reference numerals. The drawings are not necessarily drawn to scale. As used herein, ordinals such as "first," "second," and "third" are employed merely to distinguish similar elements, and different ordinals may be employed to designate a same element in the specification and/or claims.

As used herein, a field effect transistor refers to any planar transistor having a gate electrode overlying a horizontal planar channel, any fin field effect transistor having a gate electrode located on sidewalls of a semiconductor fin, or any other types of metal-oxide semiconductor field effect transistor (MOSFETs) and junction field effect transistors (JFETs).

Figure 1C:
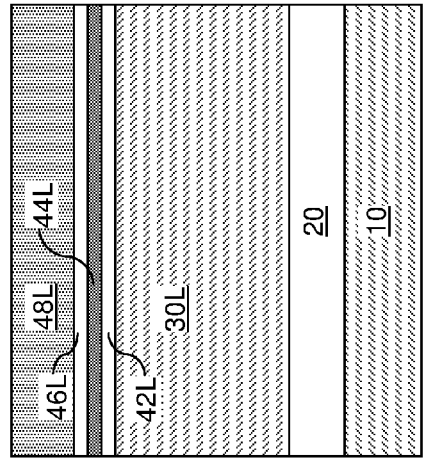
FIG. 1C is a vertical cross-sectional view of the first exemplary semiconductor structure along the vertical plane C-C' in FIG. 1A.
Figure 1B:
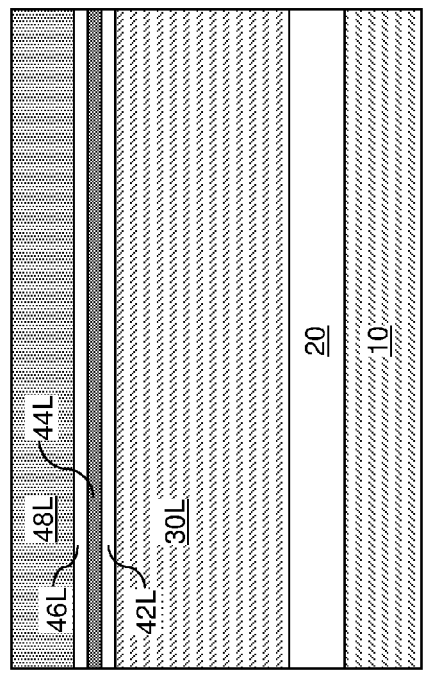
FIG. 1B is a vertical cross-sectional view of the first exemplary semiconductor structure along the vertical plane B-B' in FIG. 1A.

Referring to FIGS. 1A-1C, a first exemplary semiconductor structure according to a first embodiment of the present disclosure includes a semiconductor substrate (10, 20, 30L), a stack of pad layers (42L, 44L, 46L) formed on a top surface of the semiconductor substrate, and a hard mask layer 48L formed on the top surface of the stack of pad layers (42L, 44L, 46L). The semiconductor substrate (10, 20, 30L) includes a top semiconductor layer 30L at an upper portion thereof. In one embodiment, the semiconductor substrate (10, 20, 30L) can be a semiconductor-on-insulator (SOI) substrate containing the top semiconductor layer 30L, a buried insulator layer 20 located under the top semiconductor layer 30L, and a handle substrate 10 located under the buried insulator layer 20. Alternately, the semiconductor substrate can be a bulk semiconductor substrate having a semiconductor material throughout the entirety thereof. While the present disclosure is described employing an SOI substrate, embodiments in which a bulk semiconductor substrate is employed in lieu of an SOI substrate are expressly contemplated herein. It is understood that various doped regions and/or channel stop layers/portions can be formed in the bulk substrate to provide electrical isolation among various device components as known in the art.

The top semiconductor layer 30L includes a semiconductor material, which can be an elemental semiconductor material, an alloy thereof, a compound semiconductor material, or an organic semiconductor material. In one embodiment, the top semiconductor layer 30L includes a single crystalline semiconductor material such as single crystalline silicon, a single crystalline silicon-germanium alloy, or a single crystalline compound semiconductor material. In one embodiment, the top semiconductor layer 30L may layer 30L is that it may comprise multiple layers of semiconductors, such as a heteroepitaxial stack of SiGe on top of Si, or III-V over Si, etc. The thickness of the top semiconductor layer 30L can be in a range from 30 nm to 300 nm, although lesser and greater thicknesses can also be employed.

The stack of pad layers (42L, 44L, 46L) can include a lower semiconductor-oxide-containing pad layer 44L, a high dielectric constant (high-k) dielectric pad layer 46L, and an optional upper semiconductor-oxide-containing pad layer 46L. As used herein, a "semiconductor-oxide-containing" element refers to an element that is composed of a dielectric material that contains a semiconductor oxide. As used herein, a material "contains a semiconductor oxide" if the material is composed of a semiconductor oxide material or a semiconductor oxynitride material. Exemplary semiconductor-oxide-containing materials include silicon oxide, silicon oxynitride, an oxide of a silicon-germanium alloy, an oxynitride of a silicon-germanium alloy, an oxide of a compound semiconductor material, an oxynitride of a compound semiconductor material, etc. In an illustrative example, if the top semiconductor layer 30L includes single crystalline silicon, the lower semiconductor-oxide-containing pad layer 44L can include thermal silicon oxide. The lower semiconductor-oxide-containing pad layer 42L can be formed by chemical vapor deposition (CVD) or by thermal conversion or plasma conversion of an upper portion of the top semiconductor layer 30L. The thickness of the lower semiconductor-oxide-containing pad layer 42L can be in a range from 3 nm to 30 nm, although lesser and greater thicknesses can also be employed.

The high-k dielectric pad layer 44L includes a dielectric material having a dielectric constant greater than 8.0. The high-k dielectric pad layer 44L can include a dielectric metal oxide or a dielectric metal oxynitride that can be employed as a gate dielectric as known in the art. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The high-k dielectric pad layer 44L can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In an illustrative example, the high-k dielectric pad layer 44L may be a hafnium oxide ($HfO_2$) layer.

The optional upper semiconductor-oxide-containing pad layer 46L, if present, includes a semiconductor-oxide-containing material. The upper semiconductor-oxide-containing pad layer 46L can be formed, for example, by chemical vapor deposition. The composition of the upper semiconductor-oxide-containing pad layer 46L can be the same as, or can be different from, the dielectric material of the lower semiconductor-oxide-containing pad layer 42L. The thickness of the upper semiconductor-oxide-containing pad layer 46L can be in a range from 3 nm to 30 nm, although lesser and greater thicknesses can also be employed.

The hard mask layer 48L can include any material that can be employed as a hard mask as known in the art. In one embodiment, the hard mask layer 48L includes a dielectric material having a different composition than the material located directly underneath. For example, if the upper semiconductor-oxide-containing pad layer 46L is present, the hard mask layer 48L can include silicon nitride. The hard mask layer 48L can be deposited, for example, by chemical vapor deposition. The thickness of the hard mask layer 48L can be in a range from 30 nm to 100 nm, although lesser and greater thicknesses can also be employed.

Referring to FIGS. 2A-2C, semiconductor fins (30A, 30B) and overlying structures (42A, 42B, 44A, 44B, 46A, 46B, 48A, 48B) can be formed by patterning the stack including the top semiconductor layer 30L, the stack of pad layers (42L, 44L, 46L), and the hard mask layer 48L. For example, a photoresist layer (not shown) can be applied over the hard mask layer 48L, and lithographically patterned to define areas for semiconductor fins (30A, 30B) to be subsequently formed. The pattern in the photoresist layer can be transferred through the hard mask layer 48L by an anisotropic etch. The photoresist layer may be consumed or removed during or after the anisotropic etch. The patterned portions of the hard mask layer 48L constitute a first hard mask portion 48A and a second hard mask portion 48B. The pattern in the hard mask portions (48A, 48B) can be transferred through the stack of pad layers (42L, 44L, 46L) and the top semiconductor layer 30L by at least another isotropic etch, which can be terminated upon physical exposure of the top surface of the buried insulator layer 20.

A remaining portion of the top semiconductor layer 30L underneath the first hard mask portion 48A constitutes a first semiconductor fins 30A, and a remaining portion of the top semiconductor layer 30L underneath the second hard mask portion 48B constitutes a second semiconductor fin 30B. A remaining portion of the lower semiconductor-oxide-containing pad layer 42L underneath the first hard mask portion 48A constitutes a first lower semiconductor-oxide-containing pad portion 42A, and a remaining portion of the lower semiconductor-oxide-containing pad layer 42L underneath the second hard mask portion 48B constitutes a second lower semiconductor-oxide-containing pad portion 42B. A remaining portion of the high-k dielectric pad layer 44L underneath the first hard mask portion 48A constitutes a first high-k dielectric pad portion 44A, and a remaining portion of the high-k dielectric pad layer 44L underneath the second hard mask portion 48B constitutes a second high-k dielectric pad portion 44B. A remaining portion of the upper semiconductor-oxide-containing pad layer 46L underneath the first hard mask portion 48A constitutes a first upper semiconductor-oxide-containing pad portion 46A, and a remaining portion of the upper semiconductor-oxide-containing pad layer 46L underneath the second hard mask portion 48B constitutes a second upper semiconductor-oxide-containing pad portion 46B.

While the present disclosure is described employing an embodiment in which the hard mask layer 48L is employed and the photoresist layer is removed prior to etching the stack of the pad layers (42L, 44L, 46L), embodiments are expressly contemplated herein in which the photoresist layer is removed at a later processing step or the hard mask layer 48L is not employed. Further, embodiments are also contemplated that employ other patterning methods such as e-beam lithography and/or sidewall image transfer methods.

Figure 3A:
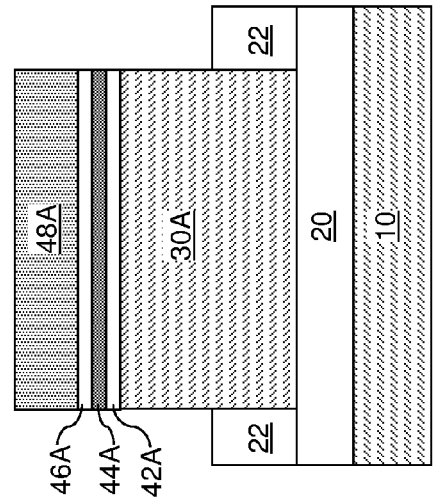
FIG. 3A is a top-down view of the first exemplary semiconductor structure after formation of a shallow trench isolation layer according to the first embodiment of the present disclosure.
Figure 3B:
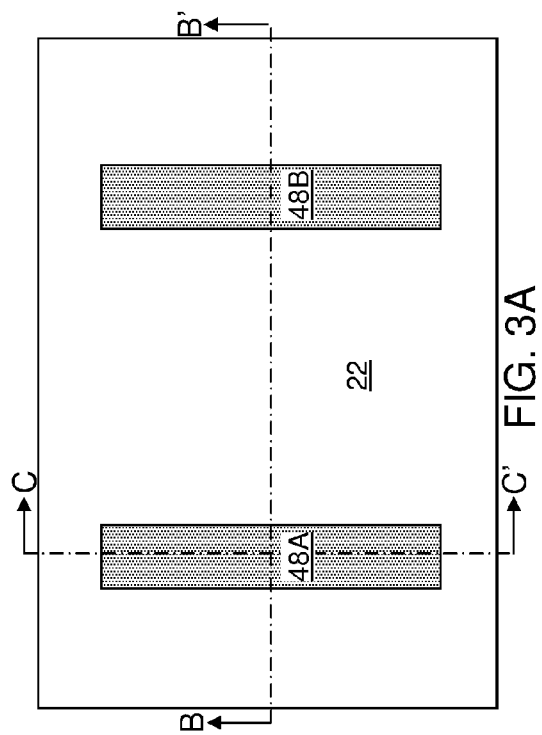
FIG. 3B is a vertical cross-sectional view of the first exemplary semiconductor structure along the vertical plane B-B' in FIG. 3A.
Figure 3C:
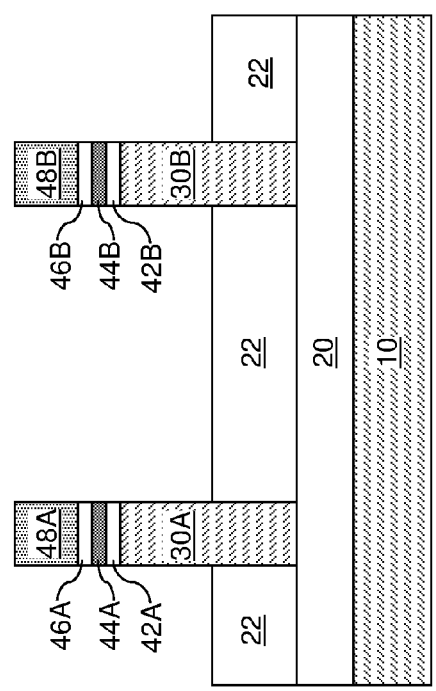
FIG. 3C is a vertical cross-sectional view of the first exemplary semiconductor structure along the vertical plane C-C' in FIG. 3A.

Referring to FIGS. 3A-3C, a shallow trench isolation layer 22 is formed on the top surface of the buried insulator layer 20 and sidewalls of a lower portion of each semiconductor fin (30A, 30B). The shallow trench isolation layer 22 can be formed, for example, by depositing a dielectric material such as silicon oxide, by planarizing the dielectric material, and by recessing the dielectric material so that the recessed horizontal surface of the dielectric material is formed between the horizontal plane including the bottom surface of the semiconductor fins (30A, 30B) and the horizontal plane including the top surface of the semiconductor fins (30A, 30B). The dielectric material of the shallow trench isolation layer 22 can be deposited, for example, by chemical vapor deposition or spin-on coating. The planarization of the dielectric material of the shallow trench isolation layer 22 can be performed, for example, by chemical mechanical planarization employing the hard mask portions (48A, 48B) as a stopping layer. The recessing of the dielectric material of the shallow trench isolation layer 22 can be performed, for example, by an anisotropic etch.

Referring to FIGS. 4A-4C, portions of a semiconductor-oxide-containing material are formed on the physically exposed portions of the sidewalls of the semiconductor fins (30A, 30B). In one embodiment, the semiconductor-oxide-containing material can be formed by thermal conversion and/or plasma conversion of surface portions of the semiconductor fins (30A, 30B) into semiconductor oxide portions or semiconductor oxynitride portions. In another embodiment, the semiconductor-oxide-containing material can be formed by chemical vapor deposition or atomic layer deposition. An anisotropic etch can be performed to remove horizontal portions of the deposited semiconductor-oxide-containing material. In yet another embodiment, the semiconductor-oxide-containing material can be formed by a combination of thermal and/or plasma conversion and a deposition method.

The combination of the first lower semiconductor-oxide-containing pad portion 42A and vertical portions of the semiconductor-oxide-containing material formed at this processing step collectively constitute a contiguous structure, which is herein referred to as a first semiconductor-oxide-containing gate dielectric 52A. The combination of the second lower semiconductor-oxide-containing pad portion 42B and vertical portions of the semiconductor-oxide-containing material formed at this processing step collectively constitute another contiguous structure, which is herein referred to as a second semiconductor-oxide-containing gate dielectric 52B. The horizontal portion of each semiconductor-oxide-containing gate dielectric (52A, 52B) may, or may not, have the same composition as vertical portions of the same semiconductor-oxide-containing gate dielectric (52A, 52B). The horizontal portion of each semiconductor-oxide-containing gate dielectric (52A, 52B) may, or may not, have the same thickness as vertical portions of the same semiconductor-containing gate dielectric (52A, 52B). In one embodiment, the vertical portions of each semiconductor-oxide-containing gate dielectric (52A, 52B) can include a thermal semiconductor oxide such as thermal silicon oxide.

The thickness of the vertical portions of the each semiconductor-containing gate dielectric (52A, 52B) can be in a range from 1 nm to 10 nm, although lesser and greater thicknesses can also be employed.

Referring to FIGS. 5A-5C, a disposable gate material layer and a disposable cap layer and can be deposited and patterned employing a combination of lithographic methods and at least one anisotropic etch to form disposable gate structures (53A, 55A, 53B, 55B). For example, the disposable gate structures (53A, 55A, 53B, 55B) may include a first disposable gate structure (53A, 55A) that is a stack of a first disposable gate material portion 53A and a first disposable cap portion 55A, and a second disposable gate structure (53B, 55B) that is a stack of a second disposable gate material portion 53B and a second disposable cap portion 55B. The disposable gate material layer can include a material that can be subsequently removed selective to dielectric materials such as a semiconductor material. The disposable cap layer can include a dielectric material such as silicon nitride.

Referring to FIGS. 6A-6C, gate spacers (56A, 56B) including a dielectric material can be optionally formed, for example, by conformal deposition of at least one dielectric material and an anisotropic etch. The at least one dielectric material can include silicon oxide, silicon nitride, or a combination thereof. Regions of the various pad portions (44A, 46A, 44B, 46B) and semiconductor-containing gate dielectric (52A, 52B) that are not masked by the gate spacers (56A, 56B) can be collaterally removed during the anisotropic etch that forms the gate spacers (56A, 56B) and/or removed by a subsequent etch. While the present disclosure is described employing an embodiment in which the gate spacers (56A, 56B) are formed prior to formation of source regions and drain region, embodiments are expressly contemplated herein in which at least a portion of source regions and drain regions is formed prior to formation of the gate spacers (56A, 56B).

Referring to FIGS. 7A-7D, source regions and drain regions can be formed in the first and second semiconductor fins (30A, 30B; See FIGS. 6A-6C) employing methods known in the art. A first source region 34A and a first drain region 36A can be formed in the first semiconductor fin (34A, 36A, 32A) by introduction of electrical dopants of a first conductivity type, which can be p-type or n-type. The portion into which the electrical dopants of the first conductivity type are not introduced constitutes a first body region 32A. P-n junctions can be formed between the first body region 32A and the first source and drain regions (34A, 36A). A second source region 34B and a second drain region 36B can be formed in the second semiconductor fin (34B, 36B, 32B) by introduction of electrical dopants of a second conductivity type, which is the opposite of the first conductivity type. The portion into which the electrical dopants of the second conductivity type are not introduced constitutes a second body region 32B. P-n junctions can be formed between the second body region 32B and the second source and drain regions (34B, 36B). Alternatively, the first body region 32A and/or the second body region 32B may be intrinsic.

Raised source regions (35A, 35B) and raised drain regions (37A, 37B) can be optionally formed by selective deposition of doped semiconductor materials. At least one disposable dielectric masking layer (not shown) may be employed to induce deposition of the deposited semiconductor material only in desired regions. Specifically, a first raised source region 35A and a second raised drain region 37A can be formed on the first source region 34A and the first drain region 34B, respectively. The first raised source region 35A and the first raised drain region 37A can have a doping of the first conductivity type. A second raised source region 35B and a second raised drain region 37B can be formed on the second source region 34B and the second drain region 34B, respectively. The second raised source region 35B and the second raised drain region 37B can have a doping of the second conductivity type. Optionally, metal semiconductor alloy regions (not shown) can be formed on the physically exposed surfaces of the raised source and drain regions (35A, 37A, 35B, 37B), or, if raised source and drain regions are not formed, on the physically exposed surfaces of the source and drain regions (34A, 36A, 34B, 36B).

Figure 8A:
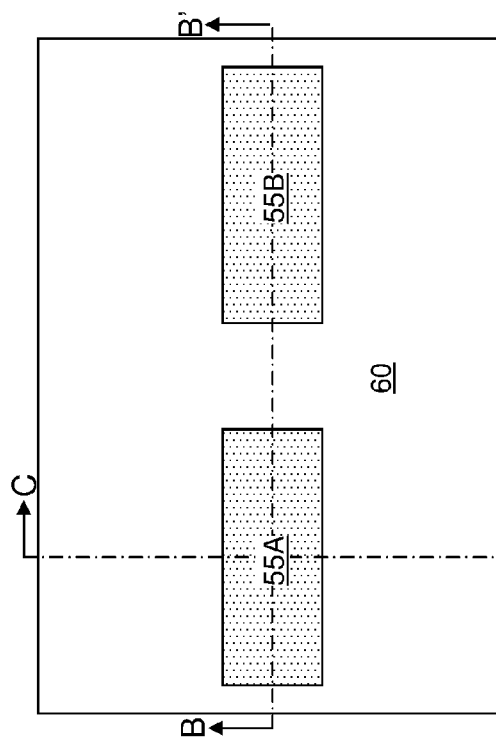
FIG. 8A is a top-down view of the first exemplary semiconductor structure after formation and planarization of a planarization dielectric layer according to the first embodiment of the present disclosure.
Figure 8C:
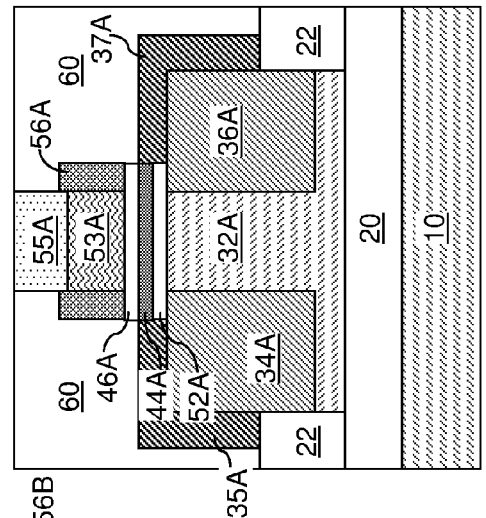
FIG. 8C is a vertical cross-sectional view of the first exemplary semiconductor structure along the vertical plane C-C' in FIG. 2A.
Figure 8B:
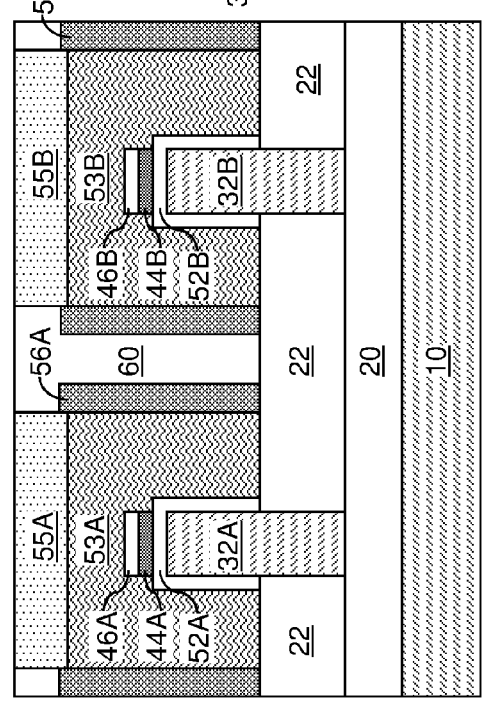
FIG. 8B is a vertical cross-sectional view of the first exemplary semiconductor structure along the vertical plane B-B' in FIG. 2A.

Referring to FIGS. 8A-8C, a planarization dielectric layer 60 can be deposited over the disposable gate structures (53A, 55A, 53B, 55B) and the semiconductor fins (32A, 34A, 36A, 32B, 34B, 36B), and can be subsequently planarized employing the disposable cap portions (55A, 55B) as a stopping layer. The planarization dielectric layer 60 can include a dielectric material that may be easily planarized. In one embodiment, the planarization dielectric layer can include a plurality of materials. For example, the planarization dielectric layer 60 can be composed of a stack including a lower layer of a doped silicate glass or an undoped silicate glass (silicon oxide) and an upper layer of silicon nitride. The planarization can be performed, for example, by chemical mechanical planarization (CMP). The planarization dielectric layer 60 laterally surrounds the semiconductor fins (32A, 34A, 36A, 32B, 34B, 36B) and the disposable gate structures (53A, 55A, 53B, 55B).

Referring to FIGS. 9A-9C, the first disposable gate structure (53A, 55A) and the second disposable gate structure (53B, 55B) are removed by at least one etch. The at least one etch can be a recess etch, which can be an isotropic etch or anisotropic etch. The etch employed to remove the disposable cap portions (55A, 55B) is selective to the dielectric material of the planarization dielectric layer 60. The etch chemistry employed to remove the disposable gate material portions (53A, 53B) can be selective to the dielectric materials of the semiconductor-oxide-containing gate dielectrics (52A, 52B) and the planarization dielectric layer 60. The first gate cavity 59A is laterally enclosed by the first gate spacer 56A and the planarization dielectric layer 60, and the second gate cavity 59B is laterally enclosed by the second gate spacer 56B and the planarization dielectric layer 60.

Referring to FIGS. 10A-10C, portions of a high dielectric constant (high-k) dielectric material having a dielectric constant greater than 8.0 are formed on the physically exposed vertical surfaces within each gate cavity (59A, 59B). The high-k dielectric material portions can include a dielectric metal oxide or a dielectric metal oxynitride that can be employed as a gate dielectric as known in the art. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The high-k dielectric material portions can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In an illustrative example, the high-k dielectric material portions may include hafnium oxide ($HfO_2$). An anisotropic etch can be performed to remove horizontal portions of the deposited high-k dielectric material. Thus, each high-k dielectric liner (54A, 54B) can be formed by deposition and an anisotropic etch of a high-k dielectric material after formation of the gate cavities (59A, 59B).

The combination of the first high-k dielectric pad portion 44A and vertical high-k dielectric material portions within the first gate cavity 59A formed at this processing step collectively constitute a contiguous structure, which is herein referred to as a first high-k dielectric liner 54A. The combination of the second high-k dielectric pad portion 44B and vertical high-k dielectric material portions within the second gate cavity 59B formed at this processing step collectively constitute another contiguous structure, which is herein referred to as a second high-k dielectric liner 54B. The horizontal portion of each high-k dielectric liner (54A, 54B) derived from a high-k dielectric pad portion (44A or 44B) may, or may not, have the same composition as vertical portions of the same high-k dielectric liner (54A, 54B). The horizontal portion of each high-k dielectric liner (54A, 54B) may, or may not, have the same thickness as vertical portions of the same high-k dielectric liner (54A, 54B). The thickness of the vertical portions of the high-k dielectric liner (54A, 54B) can be in a range from 1 nm to 4 nm, although lesser and greater thicknesses can also be employed. Each high-k dielectric liner (54A, 54B) is formed directly on the outer sidewalls of a semiconductor-oxide-containing gate dielectric (52A, 52B).

Referring to FIGS. 11A-11C, gate cavities (59A, 59B) are vertically extended by recessing of portions of the shallow trench isolation layer 22 that underlie physically exposed horizontal surfaces of the shallow trench isolation layer 22. The high-k dielectric liners (54A, 54B) and the planarization dielectric layer 60 can be employed as an etch mask during an anisotropic etch that vertically recesses the physically exposed horizontal surfaces of the shallow trench isolation 22. The chemistry of the anisotropic etch can be selected to etch the dielectric material of the shallow trench isolation layer 22 while not etching the high-k dielectric material of the high-k dielectric liners (54A, 54B). In one embodiment, the optional upper semiconductor-oxide-containing pad portions (46A, 46B) can be removed during the anisotropic etch. The high-k dielectric liners (54A, 54B) protect the underlying semiconductor-oxide-containing gate dielectrics (52A, 52B). The recess depth by which the gate cavities (59A, 59B) are vertically extended may be less than, equal to, or greater than, the thickness of the shallow trench isolation layer 22, and can be in a range from 10 nm to 100 nm, although lesser and greater recess depths can also be employed. Each gate cavity (59A, 59B) includes recesses within the shallow trench isolation layer 22. As used herein, a "recess" within an element refers to a spatial volume which the element laterally surrounds and in which the material of the element is absent.

In one embodiment, the anisotropic etch can include an isotropic component, or an isotropic etch can be separately performed at the end of the anisotropic etch. In this case, the vertical sidewalls of the shallow trench isolation layer 22 around the recessed portions can be laterally etched. In one embodiment, the isotropic etch component or the duration of the isotropic etch can be controlled such that the thickness t of each vertical portion of the shallow trench isolation layer 22 that contacts a sidewall of a semiconductor fin (32A, 34A, 36A,32B, 34B, 36B) is not less than the thickness of a vertical portion of the semiconductor-oxide-containing gate dielectrics (52A, 52B) and is not greater than the sum of the thickness of a vertical portion of the semiconductoroxide-containing gate dielectrics (52A, 52B) and the thickness of a vertical portion of a high-k dielectric liners (54A, 54B).

Referring to FIGS. 12A-12C, the high-k dielectric liners (54A, 54B) can be removed selective to the semiconductor-oxide-containing gate dielectrics (52A, 52B) and the dielectric material of the shallow trench isolation layer 22. For example, if the semiconductor-oxide-containing gate dielectrics (52A, 52B) and the dielectric material of the shallow trench isolation layer 22 include silicon oxide, an isotropic etch chemistry that etches the high-k dielectric material of the high-k dielectric liners (54A, 54B) selective to silicon oxide can be employed to remove the high-k dielectric liners (54A, 54B). The outer sidewalls of the semiconductor-oxide-containing gate dielectric (52A, 52B) can be physically exposed by removing the entirety of the high dielectric constant dielectric liners (54A, 54B).

Referring to FIGS. 13A-13C, a photoresist layer 67 can be applied in the gate cavities (59A, 59B) and over the planarization dielectric layer 60. The photoresist layer 67 is lithographically patterned to fill the first gate cavity 59A (See FIGS. 12A-12C), while physically exposing the surfaces of the second gate cavity 59B. An etch is employed to remove the second semiconductor-oxide-containing gate dielectric 52B from within the second gate cavity 59B. The etch can be an isotropic etch such as a wet etch. For example, if the second semiconductor-oxide-containing gate dielectric 52B includes silicon oxide, the isotropic etch can be a wet etch employing dilute hydrofluoric acid. In one embodiment, the dielectric material of the shallow trench isolation layer 22 can be collaterally etched so that additional area of the sidewalls of the second semiconductor fin (32B, 34B, 36B) becomes physically exposed after the isotropic etch. Further, the recessed surfaces of the shallow trench isolation layer 22 underneath the second gate cavity 59B can be further recessed so that the recessed surfaces of the shallow trench isolation layer 22 underneath the second gate cavity 59B is located within a horizontal plane that is located below another horizontal plane including the recessed surfaces of the shallow trench isolation layer 22 underneath the first gate cavity 59A (See FIGS. 12A-12C), which is filled with the photoresist layer 67 at this processing step. Subsequently, the photoresist layer 67 can be removed selective to the dielectric materials of the shallow trench isolation layer 22, the planarization dielectric layer 60, and the first semiconductor-oxide-containing gate dielectric 52A and the semiconductor material of the second semiconductor fin (32B, 34B, 36B).

Figure 14A:
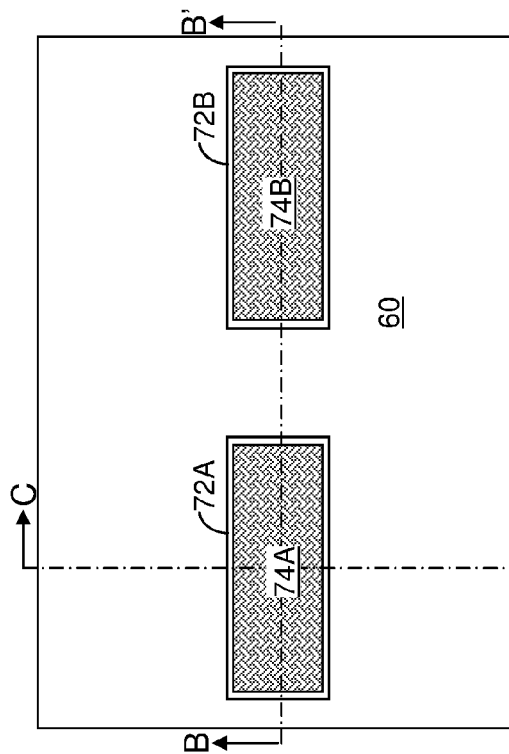
FIG. 14A is a top-down view of the first exemplary semiconductor structure after formation of replacement gate electrodes according to the first embodiment of the present disclosure.
Figure 14C:
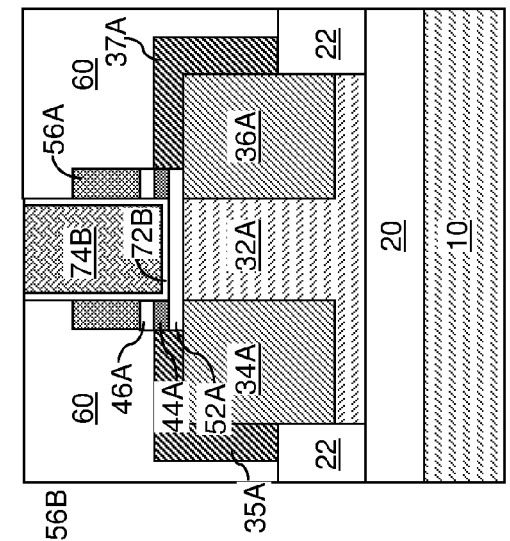
FIG. 14C is a vertical cross-sectional view of the first exemplary semiconductor structure along the vertical plane C-C' in FIG. 14A.
Figure 14B:
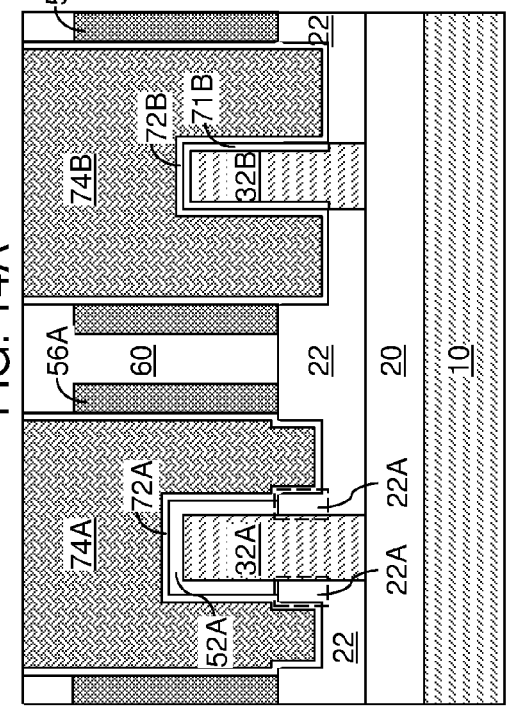
FIG. 14B is a vertical cross-sectional view of the first exemplary semiconductor structure along the vertical plane B-B' in FIG. 14A.

Referring to FIGS. 14A-14C, a high dielectric constant (high-k) gate dielectric layer can be deposited on the physically exposed surfaces within the gate cavities (59A, 59B) and on the top surface of the planarization dielectric layer 60. The high-k gate dielectric layer includes a dielectric material having a dielectric constant greater than 8.0. The high-k gate dielectric layer can include any dielectric material that can be employed for the high-k dielectric liners (54A, 54B; See FIGS. 11A-11C) as described above. The high-k gate dielectric layer can have a thickness in a range from 0.9 nm to 6 nm, although lesser and greater thicknesses can also be employed. Optionally, a chemical oxide layer 71B that includes a semiconductor oxide of the semiconductor material of the second semiconductor fin (32B, 34B, 36B) may be formed by surface treatment of the physically exposed surfaces second semiconductor fin (32B, 34B, 36B) prior to formation of the high-k gate dielectric layer. The chemical oxide layer 71B is also known as an interfacial oxide layer, and has a self-limiting thickness in a range from 0.3 nm to 1.0 nm, although lesser and greater thicknesses can also be employed.

At least one conductive material is deposited within the gate cavities (59A, 59B). The at least one conductive material can include work function metallic materials as known in the art. Further, the at least one conductive material can include a high electrical conductivity fill material such as W, Cu, Al, Ag, Au, and/or alloys thereof.

Excess portions of the high-k gate dielectric layer and the at least one conductive material can be removed from above a horizontal plane including the top surface of the planarization dielectric layer by a planarization process. The planarization process can be a chemical mechanical planarization (CMP) process. A remaining portion of the high-k gate dielectric layer within the first gate cavity 59A (See FIGS. 12A-12C) constitutes a first high-k gate dielectric 72A. A remaining portion of the at least one conductive material within the first gate cavity 59A constitutes a first gate electrode 74A. A remaining portion of the high-k gate dielectric layer within the second gate cavity 59B constitutes a second high-k gate dielectric 72B. A remaining portion of the at least one conductive material within the second gate cavity 59B constitutes a second gate electrode 74B.

The first exemplary semiconductor structure includes at least a semiconductor fin (32A, 34A, 36A) located on a substrate (10, 20); a shallow trench isolation layer 22 in contact with sidewalls of a lower portion of the semiconductor fin (32A, 34A, 36A); a semiconductor-oxide-containing gate dielectric 52A in contact with sidewalls of an upper portion of the semiconductor fin (32A, 34A, 36A); and a gate electrode 74A straddling the semiconductor fin (32A, 34A, 36A) and overlying the semiconductor-oxide-containing gate dielectric 52A. A portion of the gate electrode 74A protrudes downward into a recess within the shallow trench isolation layer 22, and is laterally spaced from the lower portion of the semiconductor fin (32A, 34A, 36A) by a vertical portion of the shallow trench isolation layer 22.

The first exemplary semiconductor structure further includes a first high dielectric constant (high-k) gate dielectric 72A having a dielectric constant greater than 8.0 and in contact with a top surface and outer sidewalls of the semiconductor-oxide-containing gate dielectric 52A and a sidewall surface of the vertical portion 22A of the shallow trench isolation layer 22 and a recessed horizontal surface of the shallow trench isolation layer 22. The first high-k dielectric portion 44A can have outer sidewalls that are vertically coincident with outer sidewalls of the first gate spacer 56A and inner sidewalls that are vertically coincident with the outer sidewalls of the first high-k gate dielectric 72A. The first high-k dielectric portion 44A may have the same composition as, or a different composition from, the first high-k gate dielectric. Also, the first upper semiconductor-oxide-containing pad portion 46A can have outer sidewalls that are vertically coincident with outer sidewalls of the first gate spacer 56A and inner sidewalls that are vertically coincident with the outer sidewalls of the first high-k gate dielectric 72A. As used herein, two surfaces are vertically coincident if there exists a vertical plane that includes the two surfaces.

The first exemplary semiconductor structure can further include a second semiconductor fin (32B, 34B, 36B) located on the substrate (10, 20); and a second high dielectric constant gate dielectric 72B in contact with sidewalls of the second semiconductor fin (32B, 34B, 36B) and having the same composition as, and the same thickness as, the first high dielectric contact gate dielectric 72A. The shallow trench isolation layer 22 can further include another recessed portion having a horizontal recess surface that is located below a horizontal plane including a recessed surface of the shallow trench isolation layer that underlies the gate electrode 72A overlying the semiconductor fin (32A, 34A, 36A). A second high-k gate dielectric (including a remaining portion from the second high-k gate dielectric 44B in FIG. 7D) can have outer sidewalls that are vertically coincident with outer sidewalls of the second gate spacer 56B and inner sidewalls that are vertically coincident with the outer sidewalls of the second high-k gate dielectric 72B. Also, the second upper semiconductor-oxide-containing pad portion 46B can have outer sidewalls that are vertically coincident with outer sidewalls of the second gate spacer 56B and inner sidewalls that are vertically coincident with the outer sidewalls of the second high-k gate dielectric 72B.

In one embodiment, the vertical portion 22A of the shallow trench isolation layer 22 can differ from the semiconductor-oxide-containing gate dielectric 54A by at least one of composition and thickness. The entirety of each sidewall of the semiconductor fins (32A, 34A, 36A, 32B, 34B, 36B) can be within a same vertical plane. Thus, each sidewall of the upper portion of the semiconductor fin (32A, 34A, 36A) can be vertically coincident with a sidewall of the lower portion of the semiconductor fin (32A, 34A, 36A).

Referring to FIGS. 15A-15C, a second exemplary semiconductor structure according to a second embodiment of the present disclosure can be derived from the first exemplary semiconductor structure of FIGS. 4A-4C by performing the processing steps of FIGS. 10A-10C after performing the processing steps of FIGS. 4A-4C and without performing the processing steps of FIGS. 5A-9C.

Thus, in the second embodiment, the high-k dielectric liners (54A, 54B) are formed by deposition and an anisotropic etch of a dielectric material prior to formation of disposable gate structures (53A, 55A, 53B, 55B; See FIGS. 6A-6C), a planarization dielectric layer 60 (See FIGS. 8A-8C), or gate cavities (59A, 59B; See FIGS. 9A-9C). The high-k dielectric liners (54A, 54B) are formed directly on the entire outer sidewalls of the semiconductor-oxide-containing gate dielectrics (52A, 52B).

Referring to FIGS. 16A-16C, the processing steps of FIGS. 5A-5C, 6A-6C, and 7A-7D are performed to form disposable gate structures (53A, 55A, 53B, 55B; See FIGS. 5A-5C), gate spacers (56A, 56B; See FIGS. 6A-6C), source and drain regions (34A, 36A, 34B, 36B; See FIGS. 7A-7D), and raised source and drain regions (35A, 37A, 35B, 37B; See FIGS. 7A-7D).

Figure 17A:
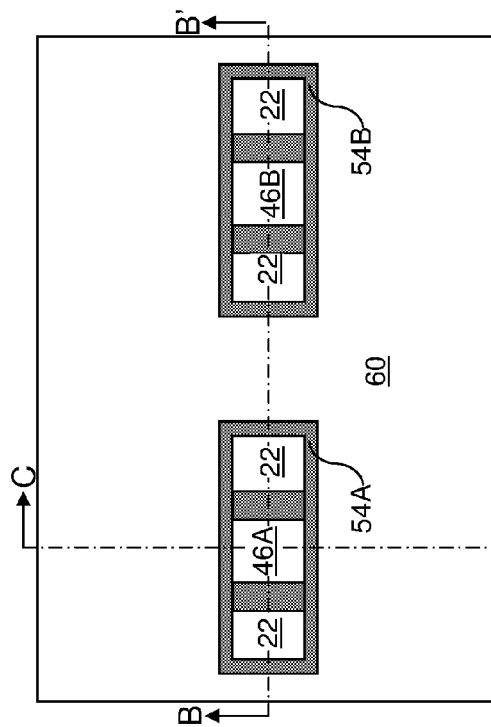
FIG. 17A is a top-down view of the second exemplary semiconductor structure after formation of gate cavities according to the second embodiment of the present disclosure.
Figure 17C:
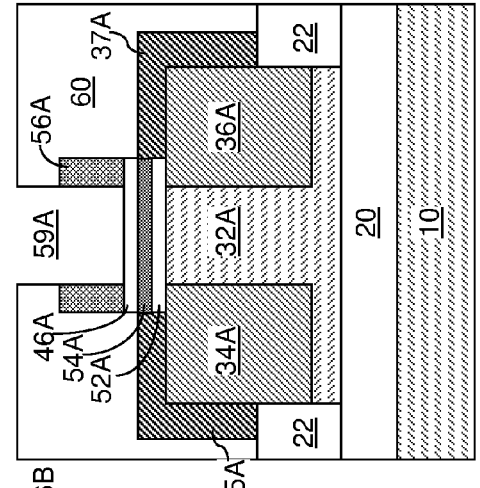
FIG. 17C is a vertical cross-sectional view of the second exemplary semiconductor structure along the vertical plane C-C' in FIG. 17A.
Figure 17B:
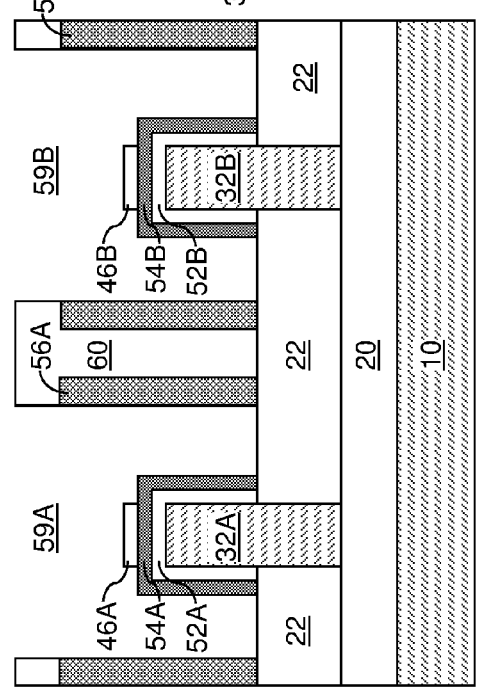
FIG. 17B is a vertical cross-sectional view of the second exemplary semiconductor structure along the vertical plane B-B' in FIG. 17A.

Referring to FIGS. 17A-17C, the processing steps of FIGS. 8A-8C and 9A-9C are performed to form a planarization dielectric layer 60 (See FIGS. 8A-8C) and gate cavities (59A, 59B). The removal of the disposable gate structures (53A, 55A, 53B, 55B) can be performed selective to the high-k dielectric liners (54A, 54B).

Referring to FIGS. 18A-18C, the processing steps of FIGS. 11A-11C, 12A-12C, 13A-13C, and 14A-14C are performed to form various gate dielectrics (52A, 72A, 72B) and various gate electrodes (74A, 74B). The second exemplary semiconductor structure of FIGS. 18A-18C can be the same as the first exemplary semiconductor structure of FIGS. 14A-14C.

Figure 19C:
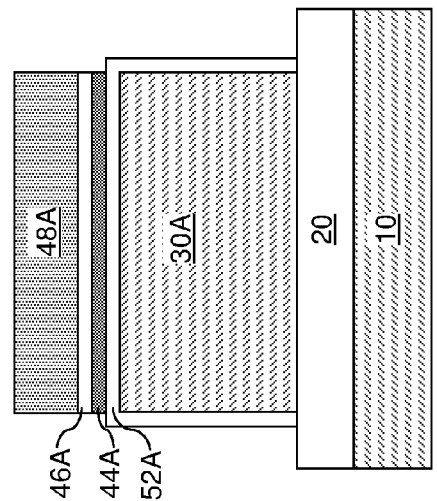
FIG. 19C is a vertical cross-sectional view of the third exemplary semiconductor structure along the vertical plane C-C' in FIG. 19A.
Figure 19A:
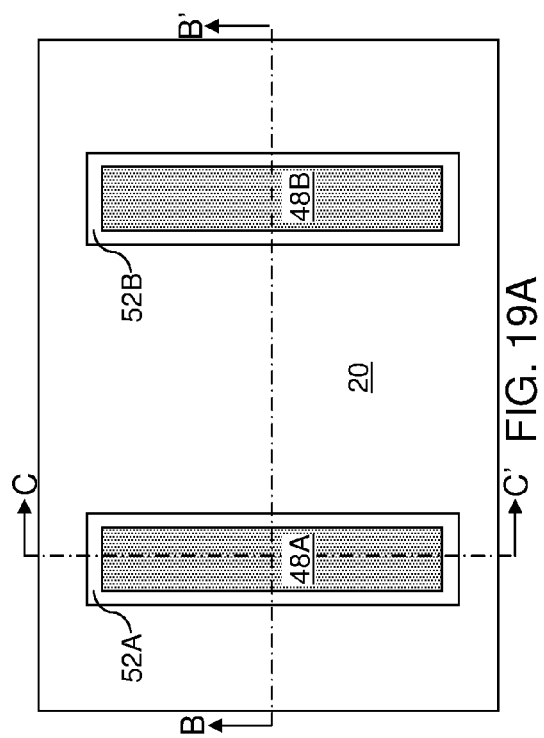
FIG. 19A is a top-down view of a third exemplary semiconductor structure after formation of semiconductor fins and semiconductor-oxide-containing gate dielectrics according to a third embodiment of the present disclosure.
Figure 19B:
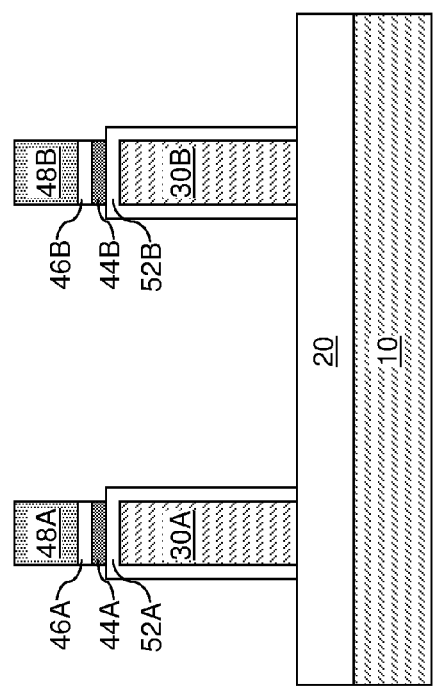
FIG. 19B is a vertical cross-sectional view of the third exemplary semiconductor structure along the vertical plane B-B' in FIG. 19A.

Referring to FIGS. 19A-19C, a third exemplary semiconductor structure according to a third embodiment of the present disclosure can be derived from the first exemplary semiconductor structure of FIGS. 2A-2C by performing the processing steps of FIGS. 4A-4C without performing the processing steps of FIGS. 3A-3C. The semiconductor-oxide-containing gate dielectrics (52A, 52B) are formed on the entire sidewall surfaces of the semiconductor fins (30A, 30B) and the entire top surfaces of the semiconductor fins (30A, 30B). Thus, in the third embodiment, the semiconductor-oxide-containing gate dielectrics (52A, 52B) are formed prior to formation of a shallow trench isolation layer.

Figure 20C:
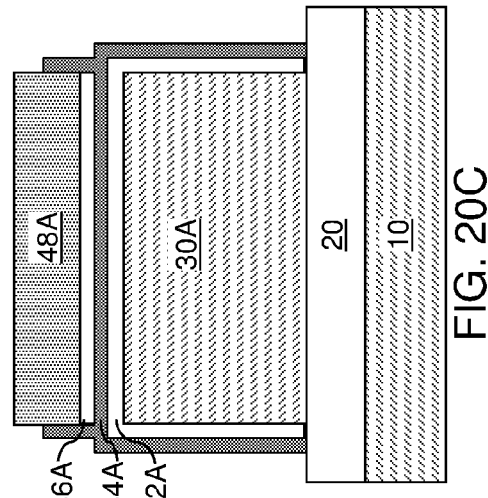
FIG. 20C is a vertical cross-sectional view of the third exemplary semiconductor structure along the vertical plane C-C' in FIG. 20A.
Figure 20A:
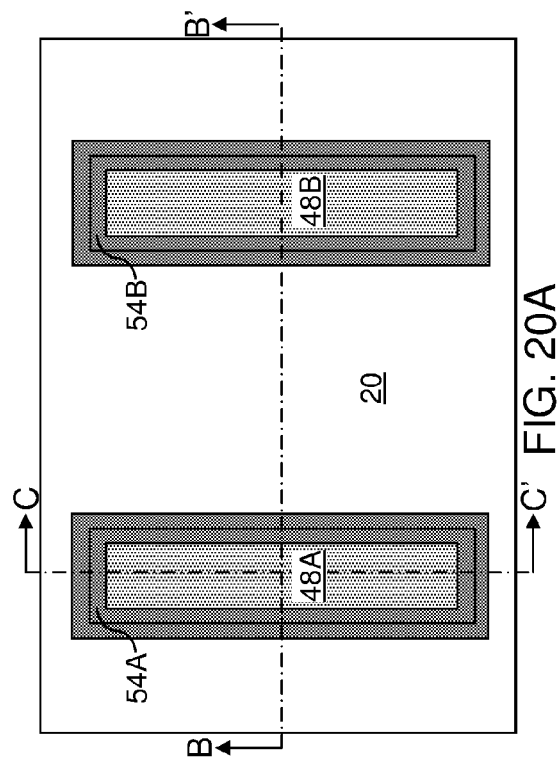
FIG. 20A is a top-down view of the third exemplary semiconductor structure after formation of semiconductor high-k dielectric liners according to the third embodiment of the present disclosure.
Figure 20B:
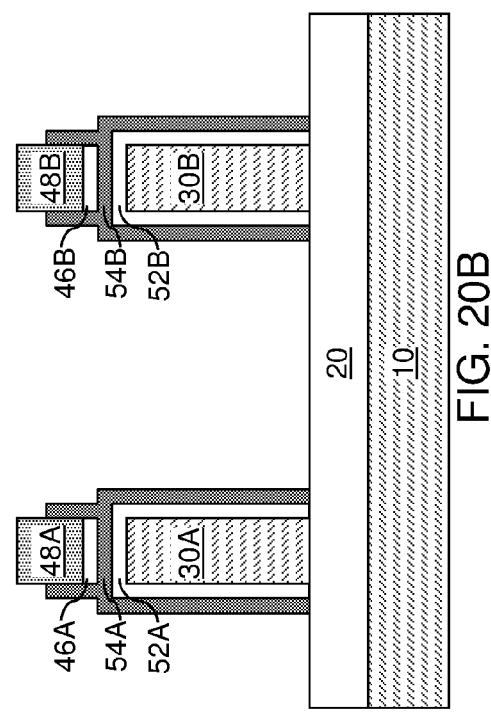
FIG. 20B is a vertical cross-sectional view of the third exemplary semiconductor structure along the vertical plane B-B' in FIG. 20A.

Referring to FIGS. 20A-20C, the processing steps of FIGS. 10A-10C are performed to form a first high-k dielectric liner 54A and a second high-k dielectric liner 54B. Specifically, the first and second high-k dielectric liners (54A, 54B) can be formed by deposition and an anisotropic etch of a high-k dielectric material. The formation of the high-k dielectric liners (54A, 54B) is performed prior to formation of disposable gate structures.

Referring to FIGS. 21A-21C, a shallow trench isolation layer 22 is formed by performing the processing steps of FIGS. 3A-3C. The top surface of the shallow trench isolation layer 22 is formed between a horizontal plane including the top surfaces of the semiconductor fins (30A, 30B) and a horizontal plane including the bottom surfaces of the semiconductor fins (30A, 30B).

Referring to FIGS. 22A-22C, the processing steps of FIGS. 5A-5C, 6A-6C, and 7A-7D are performed to form disposable gate structures (53A, 55A, 53B, 55B; See FIGS. 5A-5C), gate spacers (56A, 56B; See FIGS. 6A-6C), source and drain regions (34A, 36A, 34B, 36B; See FIGS. 7A-7D), and raised source and drain regions (35A, 37A, 35B, 37B; See FIGS. 7A-7D).

Figure 23A:
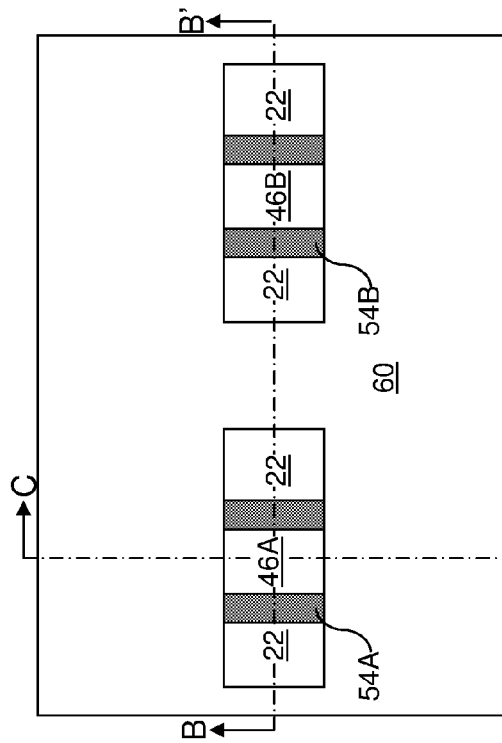
FIG. 23A is a top-down view of the third exemplary semiconductor structure after formation of a planarization dielectric layer and grate cavities according to the third embodiment of the present disclosure.
Figure 23C:
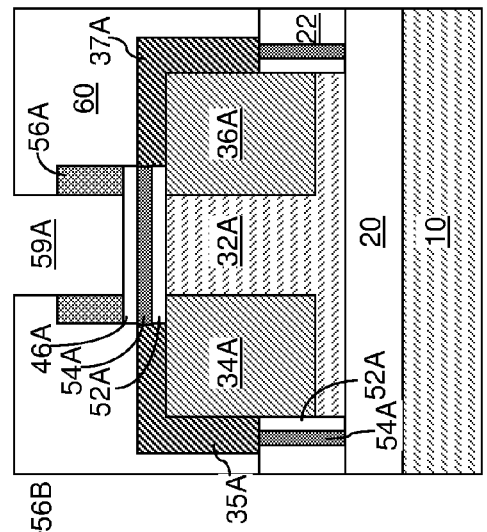
FIG. 23C is a vertical cross-sectional view of the third exemplary semiconductor structure along the vertical plane C-C' in FIG. 23A.
Figure 23B:
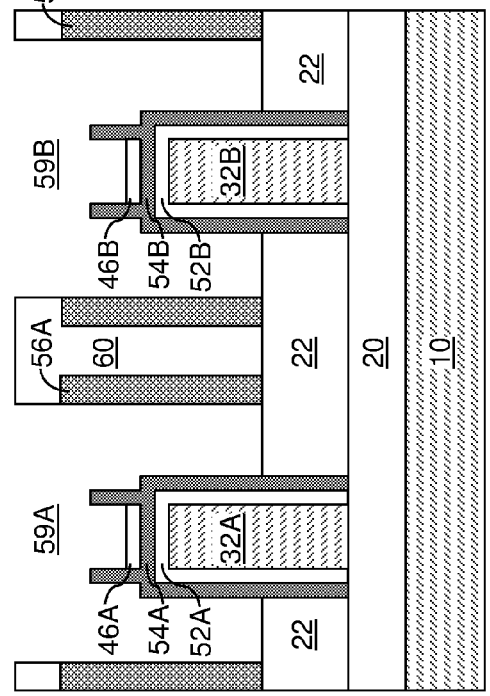
FIG. 23B is a vertical cross-sectional view of the third exemplary semiconductor structure along the vertical plane B-B' in FIG. 23A.

Referring to FIGS. 23A-23C, the processing steps of FIGS. 8A-8C and 9A-9C are performed to form a planarization dielectric layer 60 (See FIGS. 8A-8C) and gate cavities (59A, 59B). The removal of the disposable gate structures (53A, 55A, 53B, 55B) can be performed selective to the high-k dielectric liners (54A, 54B) and/or the upper semiconductor-oxide-containing pad portions (46A, 46B).

Referring to FIGS. 24A-24C, the processing steps of FIGS. 11A-11C can be performed to vertically extend the gate cavities (59A, 59B) by recessing of portions of the shallow trench isolation layer 22 that underlie physically exposed horizontal surfaces of the shallow trench isolation layer 22. The high-k dielectric liners (54A, 54B) and the planarization dielectric layer 60 can be employed as an etch mask during an anisotropic etch that vertically recesses the physically exposed horizontal surfaces of the shallow trench isolation 22. The chemistry of the anisotropic etch can be selected to etch the dielectric material of the shallow trench isolation layer 22 while not etching the high-k dielectric material of the high-k dielectric liners (54A, 54B). In one embodiment, the optional upper semiconductor-oxide-containing pad portions (46A, 46B) can be removed during the anisotropic etch. The high-k dielectric liners (54A, 54B) protect the underlying semiconductor-oxide-containing gate dielectrics (52A, 52B). The recess depth by which the gate cavities (59A, 59B) are vertically extended may be less than, equal to, or greater than the thickness of the shallow trench isolation layer 22, and can be in a range from 10 nm to 100 nm, although lesser and greater recess depths can also be employed.

Figure 25A:
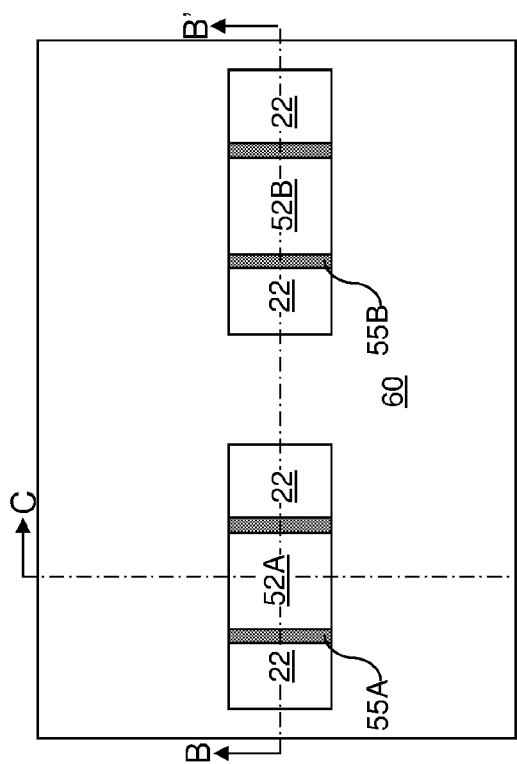
FIG. 25A is a top-down view of the third exemplary semiconductor structure after removal of physically exposed portions of the high-k dielectric liners according to the third embodiment of the present disclosure.
Figure 25C:
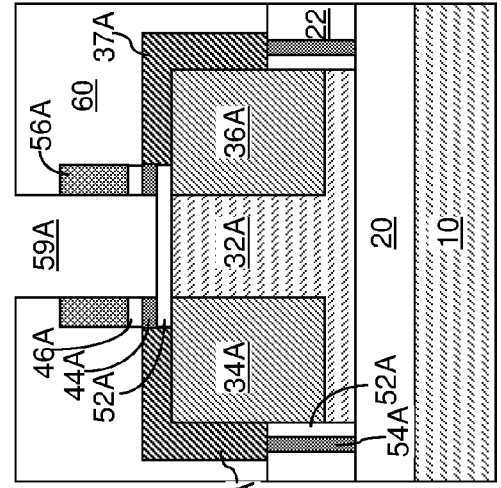
FIG. 25C is a vertical cross-sectional view of the third exemplary semiconductor structure along the vertical plane C-C' in FIG. 25A.
Figure 25B:
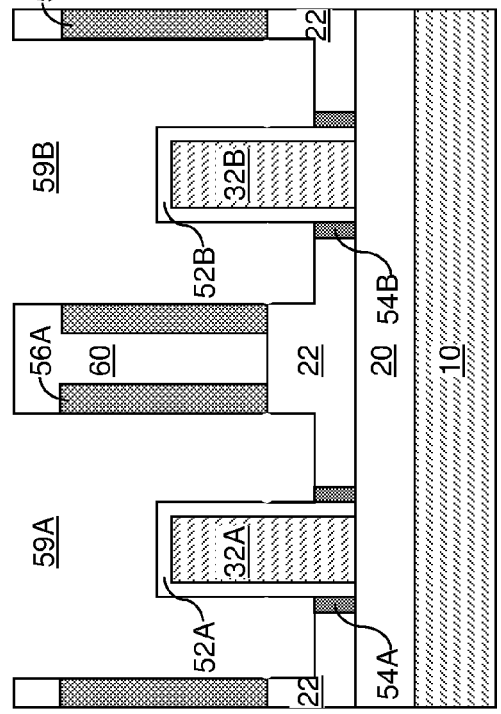
FIG. 25B is a vertical cross-sectional view of the third exemplary semiconductor structure along the vertical plane B-B' in FIG. 25A.

Referring to FIGS. 25A-25C, the processing steps of FIGS. 12A-12C can be performed to remove physically exposed portions of the high-k dielectric liners (54A, 54B) selective to the semiconductor-oxide-containing gate dielectrics (52A, 52B) and the dielectric material of the shallow trench isolation layer 22. For example, if the semiconductor-oxide-containing gate dielectrics (52A, 52B) and the dielectric material of the shallow trench isolation layer 22 include silicon oxide, an isotropic etch chemistry that etches the high-k dielectric material of the high-k dielectric liners (54A, 54B) selective to silicon oxide can be employed to remove the physically exposed portions of the high-k dielectric liners (54A, 54B). The outer sidewalls of the semiconductor-oxide-containing gate dielectric (52A, 52B) can be physically exposed by removing the physically exposed portions of the high dielectric constant dielectric liners (54A, 54B), which are upper portions of the high dielectric constant dielectric liners (54A, 54B) located above the recessed top surface of the shallow trench isolation layer 22.

Figure 26A:
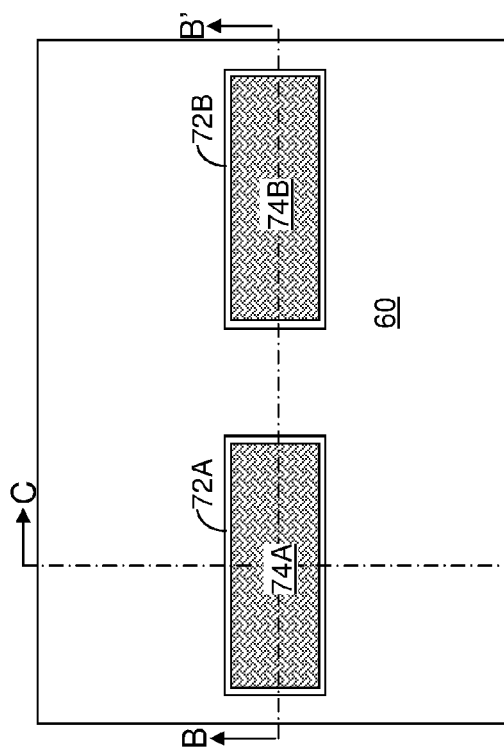
FIG. 26A is a top-down view of the third exemplary semiconductor structure after formation of replacement gate structures according to the third embodiment of the present disclosure.
Figure 26C:
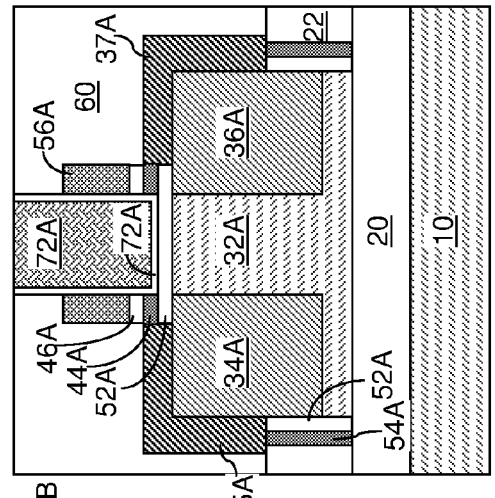
FIG. 26C is a vertical cross-sectional view of the third exemplary semiconductor structure along the vertical plane C-C' in FIG. 26A.
Figure 26B:
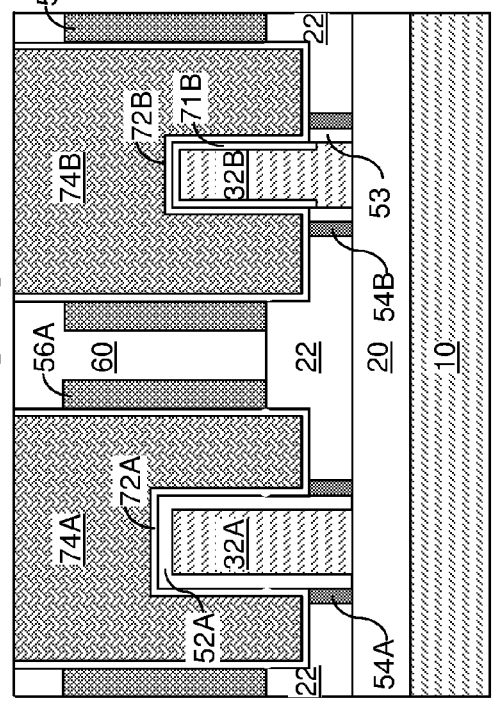
FIG. 26B is a vertical cross-sectional view of the third exemplary semiconductor structure along the vertical plane B-B' in FIG. 26A.

Referring to FIGS. 26A-26C, the processing steps of FIGS. 13A-13C and 14A-14C can be performed to form various gate dielectrics (52A, 72A, 72B) and various gate electrodes (74A, 74B). The third exemplary semiconductor structure includes at least a semiconductor fin (32A, 34A, 36A) located on a substrate (10, 20); a semiconductor-oxide-containing gate dielectric 52A in contact with sidewalls of the semiconductor fin (32A, 34A, 36A) and a top surface of the substrate (10, 20); a high dielectric constant dielectric liner 54A having a dielectric constant greater than 8.0 and contacting, and laterally surrounding, a lower portion of the semiconductor-oxide-containing gate dielectric 52A; a shallow trench isolation layer 22 laterally surrounding at least a portion of the high dielectric constant dielectric liner 54A; and a gate electrode 74A straddling the semiconductor fin (32A, 34A, 36A) and overlying the semiconductor-oxide-containing gate dielectric 52A and the high dielectric constant dielectric liner 54A. A portion of the gate electrode 74A protrudes downward into a recess within the shallow trench isolation layer 22.

The third exemplary semiconductor structure further includes a high dielectric constant gate dielectric 72A having a dielectric constant greater than 8.0 and in contact with a top surface and outer sidewalls of the semiconductor-oxide-containing gate dielectric 52A, a topmost surface of the high dielectric constant dielectric liner 54A, and a recessed horizontal surface of the shallow trench isolation layer 22. The first high-k dielectric portion 44A can have outer sidewalls that are vertically coincident with outer sidewalls of the first gate spacer 56A and inner sidewalls that are vertically coincident with the outer sidewalls of the first high-k gate dielectric 72A. The first high-k dielectric portion 44A may have the same composition as, or a different composition from, the first high-k gate dielectric. Also, the first upper semiconductor-oxide-containing pad portion 46A can have outer sidewalls that are vertically coincident with outer sidewalls of the first gate spacer 56A and inner sidewalls that are vertically coincident with the outer sidewalls of the first high-k gate dielectric 72A.

The third exemplary semiconductor structure can further include a second semiconductor fin (32B, 34B, 36B) located on the substrate (10, 20); and a second high dielectric constant gate dielectric 72B located on sidewalls of the second semiconductor fin (32B, 34B, 36B) and having the same composition as, and the same thickness as, the high dielectric contact gate dielectric 72A. A second high-k gate dielectric including a remaining portion from the second high dielectric constant dielectric liner 54B in FIG. 23B can have outer sidewalls that are vertically coincident with outer sidewalls of the second gate spacer 56B and inner sidewalls that are vertically coincident with the outer sidewalls of the second high-k gate dielectric 72B. Also, a second upper semiconductor-oxide-containing pad portion 46B (which is a remaining portion of the upper semiconductor-oxide-containing pad portion 46B in FIG. 23B) can have outer sidewalls that are vertically coincident with outer sidewalls of the second gate spacer 56B and inner sidewalls that are vertically coincident with the outer sidewalls of the second high-k gate dielectric 72B.

The third exemplary semiconductor structure can further include a semiconductor-oxide-containing dielectric portion 53, which is a remaining portion of the second semiconductor-oxide-containing gate dielectric 54B. The semiconductor-oxide-containing dielectric portion 53 contacts, and laterally surrounds, a lower portion of the second semiconductor fin (32B, 34B, 36B), and has the same thickness as the semiconductor-oxide-containing gate dielectric 52A. The third exemplary semiconductor structure can further include a second high dielectric constant dielectric liner 54B having the same composition as, and the same thickness as, the high dielectric constant dielectric liner 54A, and contacting, and laterally surrounding, the semiconductor-oxide-containing portion 53.

Referring to FIGS. 27A-27C, a fourth exemplary semiconductor structure according to a fourth embodiment of the present disclosure is derived from the third exemplary semiconductor structure of FIGS. 19A-19C by depositing a high-k dielectric material employing a processing step of FIGS. 20A-20C without performing an anisotropic etch on the deposited high-k dielectric material. The combination of the first high-k dielectric pad portion 44A, the second high-k dielectric pad portion 44B, and the deposited high-k dielectric material collectively constitute a contiguous structure, which is herein referred to as a high-k dielectric liner 54L. The horizontal portion of the high-k dielectric liner 54L derived from the high-k dielectric pad portions (44A, 44B) may, or may not, have the same composition as the deposited dielectric material. The thickness of the vertical portions of the high-k dielectric liner 54L can be in a range from 1 nm to 4 nm, although lesser and greater thicknesses can also be employed. The high-k dielectric liner 54L is formed directly on the outer sidewalls of a semiconductor-oxide-containing gate dielectric (52A, 52B). The high-k dielectric layer 54L is formed prior to formation of a shallow trench isolation layer 22.

Referring to FIGS. 28A-28C, a dielectric material such as silicon oxide is deposited and planarized to form a shallow trench isolation layer 22. The shallow trench isolation layer 22 is formed directly on a horizontal surface of a portion of the high-k dielectric liner 54L in contact with the top surface of the substrate (10, 20). The shallow trench isolation layer 22 can be planarized by chemical mechanical planarization (CMP) employing the top surfaces of the hard mask portions (48A, 48B) as a stopping layer. The shallow trench isolation layer 22 can be subsequently vertically recessed so that the recessed surface of the shallow trench isolation layer 22 is formed between the horizontal plane including the top surfaces of the hard mask portions (48A, 48B) and the horizontal plane including the bottom surfaces of the hard mask portions (48A, 48B). Subsequently, physically exposed portions of the high-k dielectric liner 54L can be removed, for example, by an isotropic etch.

Referring to FIGS. 29A-29C, the shallow trench isolation layer 22 can be further recessed such that the recessed top surface of the shallow trench isolation layer 22 is formed between the horizontal plane including the top surfaces of the semiconductor fins (30A, 30B) and the horizontal plane including the bottom surfaces of the semiconductor fins (30A, 30B). The recessing of the shallow trench isolation layer 22 can be performed selective to the dielectric material of the high-k dielectric liner 54L. The hard mask portions (48A, 48B) can be subsequently removed, for example, by an isotropic etch. For example, if the hard mask portions (48A, 48B) include silicon nitride, a wet etch employing hot phosphoric acid can be employed to remove the hard mask portions (48A, 48B).

Figure 30A:
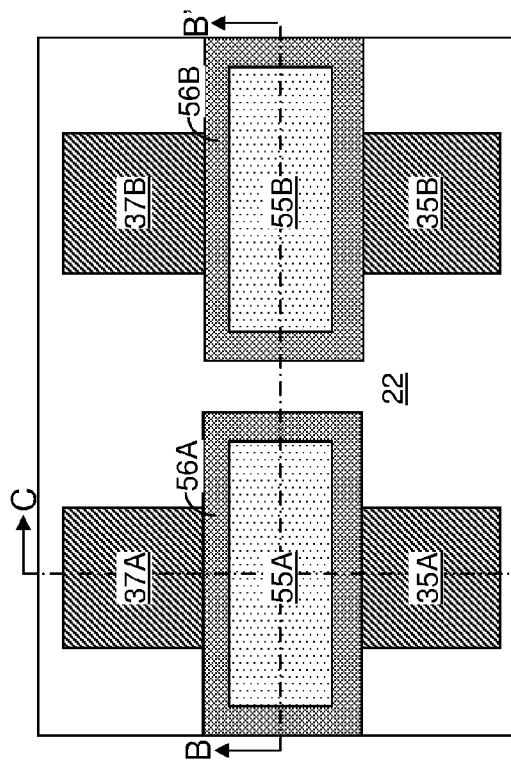
FIG. 30A is a top-down view of the fourth exemplary semiconductor structure after formation of disposable gate structures, gate spacers, source regions, drain regions, raised source regions, and raised drain regions according to the fourth embodiment of the present disclosure.
Figure 30C:
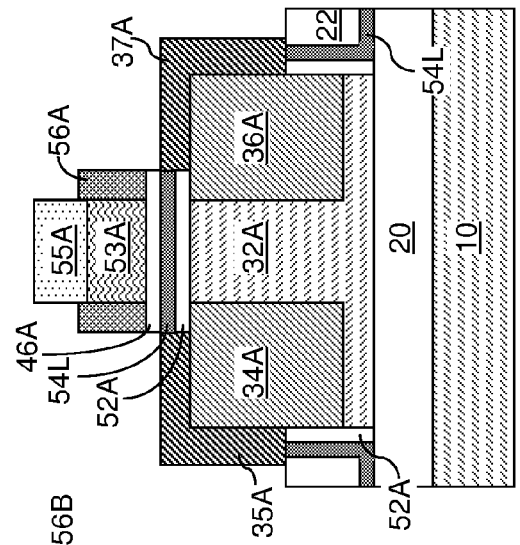
FIG. 30C is a vertical cross-sectional view of the fourth exemplary semiconductor structure along the vertical plane C-C' in FIG. 30A.
Figure 30B:
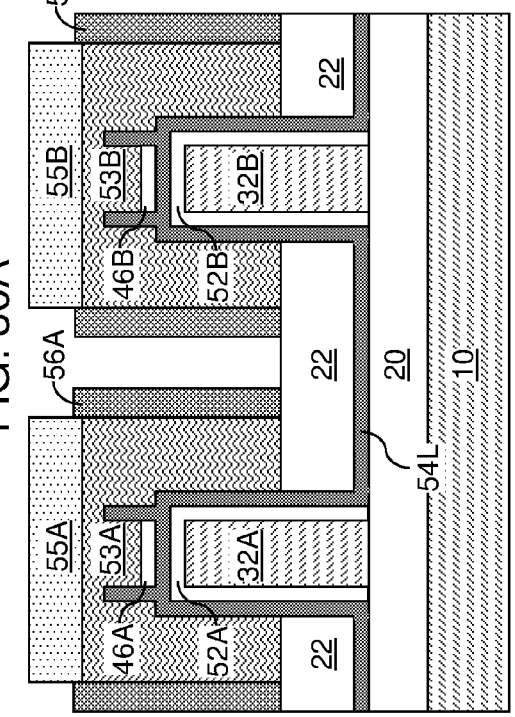
FIG. 30B is a vertical cross-sectional view of the fourth exemplary semiconductor structure along the vertical plane B-B' in FIG. 30A.

Referring to FIGS. 30A-30C, the processing steps of FIGS. 5A-5C, 6A-6C, and 7A-7D can be performed to form disposable gate structures (53A, 55A, 53B, 55B; See FIGS. 5A-5C), gate spacers (56A, 56B; See FIGS. 6A-6C), source and drain regions (34A, 36A, 34B, 36B; See FIGS. 7A-7D), and raised source and drain regions (35A, 37A, 35B, 37B; See FIGS. 7A-7D).

Referring to FIGS. 31A-31C, the processing steps of FIGS. 23A-23C, 24A-24C, 25A-25C, and 26A-26C are performed to form a planarization dielectric layer 60 (See FIGS. 8A-8C), to form gate cavities (59A, 59B; See FIGS. 8A-8C), to vertically extend the gate cavities (59A, 59B), to remove physically exposed portions of the high-k dielectric liner 54L selective to the semiconductor-oxide-containing gate dielectrics (52A, 52B) and the dielectric material of the shallow trench isolation layer 22, and to form various gate dielectrics (52A, 72A, 72B) and various gate electrodes (74A, 74B). In the fourth exemplary semiconductor structure, a single contiguous high-k dielectric liner 54L can laterally surround a semiconductor-oxide-containing gate dielectric 52A on a first semiconductor fin (32A, 34A, 36A) and a semiconductor-oxide-containing dielectric portion 53 on a second semiconductor fin (32B, 34B, 36B).

Referring to FIGS. 32A-32C, a variation of the first exemplary semiconductor is illustrated, which is derived from the first exemplary semiconductor structure of FIGS. 10A-10C by removing the second high-k dielectric liner 54B selective to the first high-k dielectric liner 54A employing a masked etch. For example, a patterned mask layer (such as a patterned photoresist layer, not shown in drawings) can be formed over the first exemplary semiconductor structure of FIGS. 10A-10C such that the patterned mask layer protects the first high-k dielectric liner 54A, while the second high-k dielectric liner 54B is not covered by the patterned mask layer. An etch process can be employed to remove the second high-k dielectric liner 54B. The patterned mask layer can be subsequently removed. A remaining portion of the second high-k dielectric liner 54B can be substantially the same as the second high-k dielectric pad portion 44B. The processing steps of FIGS. 11A-11C, 12A-12C, 13A-13C, and 14A-14C can be subsequently performed.

Referring to FIGS. 33A-33C, a variation of the second exemplary semiconductor is illustrated, which is derived from the second exemplary semiconductor structure of FIGS. 15A-15C by removing the second high-k dielectric liner 54B selective to the first high-k dielectric liner 54A employing a masked etch. For example, a patterned mask layer (such as a patterned photoresist layer, not shown in drawings) can be formed over the second exemplary semiconductor structure of FIGS. 15A-15C such that the patterned mask layer protects the first high-k dielectric liner 54A, while the second high-k dielectric liner 54B is not covered by the patterned mask layer. An etch process can be employed to remove the second high-k dielectric liner 54B. The patterned mask layer can be subsequently removed. A remaining portion of the second high-k dielectric liner 54B can be substantially the same as the second high-k dielectric pad portion 44B. The remaining processing steps of the second embodiment can be subsequently performed.

Referring to FIGS. 34A-34C, a variation of the third exemplary semiconductor is illustrated, which is derived from the third exemplary semiconductor structure of FIGS. 20A-20C by removing the second high-k dielectric liner 54B selective to the first high-k dielectric liner 54A employing a masked etch. For example, a patterned mask layer (such as a patterned photoresist layer, not shown in drawings) can be formed over the third exemplary semiconductor structure of FIGS. 20A-20C such that the patterned mask layer protects the first high-k dielectric liner 54A, while the second high-k dielectric liner 54B is not covered by the patterned mask layer. An etch process can be employed to remove the second high-k dielectric liner 54B. The patterned mask layer can be subsequently removed. A remaining portion of the second high-k dielectric liner 54B can be substantially the same as the second high-k dielectric pad portion 44B. The remaining processing steps of the third embodiment can be subsequently performed. A resulting semiconductor structure is illustrated in FIGS. 35A-35C.

Figure 36A:
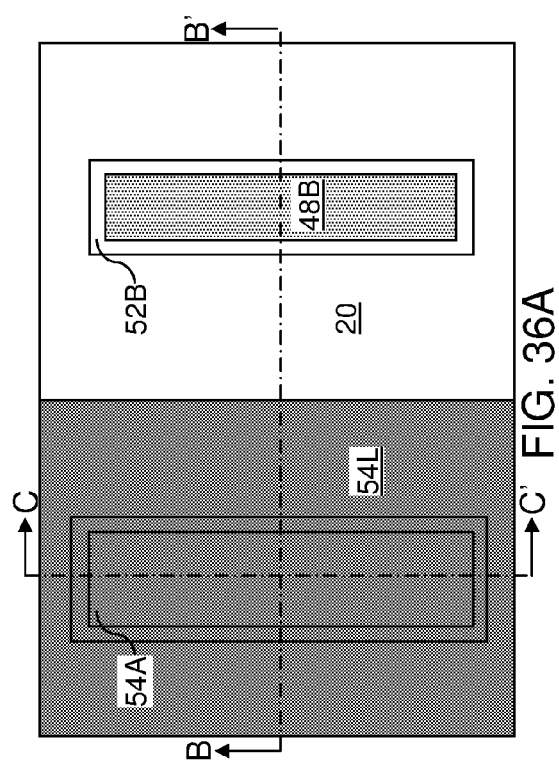
FIG. 36A is a top-down view of a variation of the fourth exemplary semiconductor structure after selective removal of a second high-k dielectric liner according to the fourth embodiment of the present disclosure.
Figure 36C:
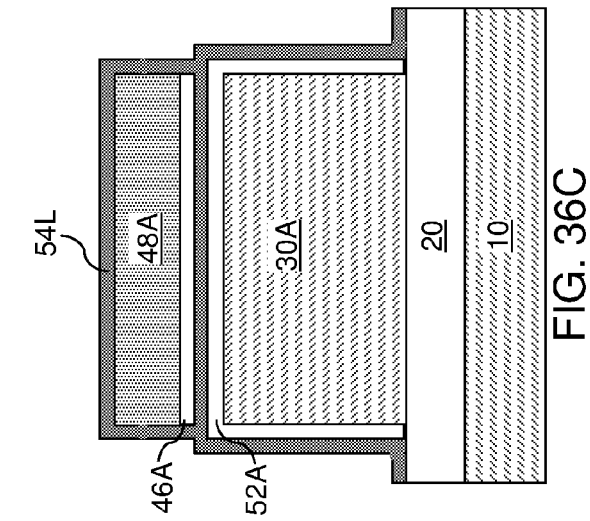
FIG. 36C is a vertical cross-sectional view of the variation of the exemplary semiconductor structure along the vertical plane C-C' in FIG. 36A.
Figure 36B:
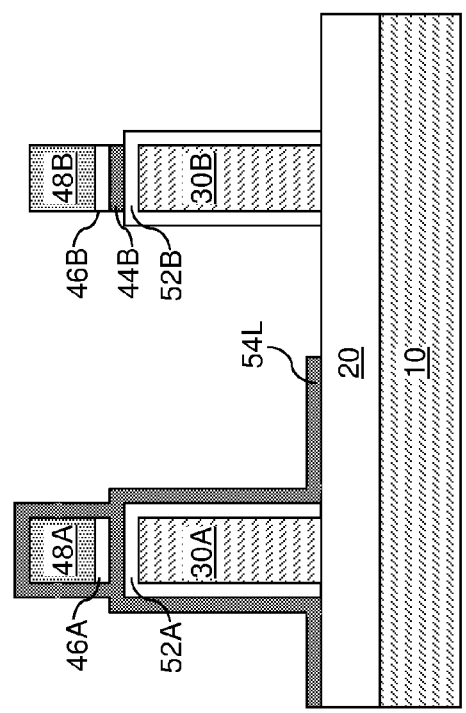
FIG. 36B is a vertical cross-sectional view of the variation of the fourth exemplary semiconductor structure along the vertical plane B-B' in FIG. 36A.
Figure 37A:
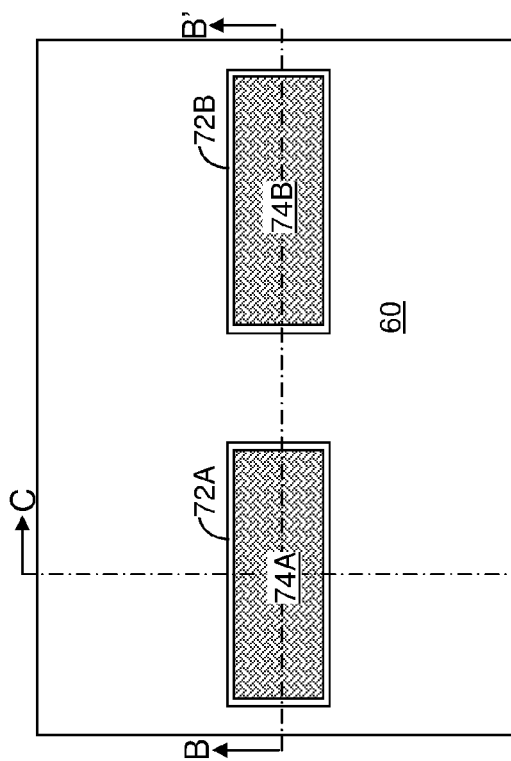
FIG. 37A is a top-down view of a variation of the fourth exemplary semiconductor structure after formation of gate electrodes according to the fourth embodiment of the present disclosure.
Figure 37C:
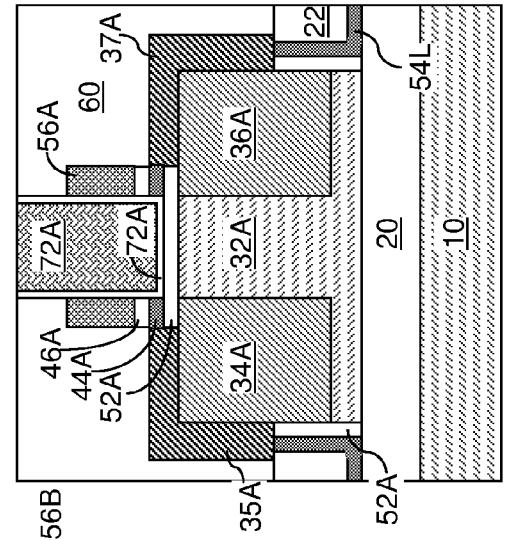
FIG. 37C is a vertical cross-sectional view of the variation of the exemplary semiconductor structure along the vertical plane C-C' in FIG. 37A.
Figure 37B:
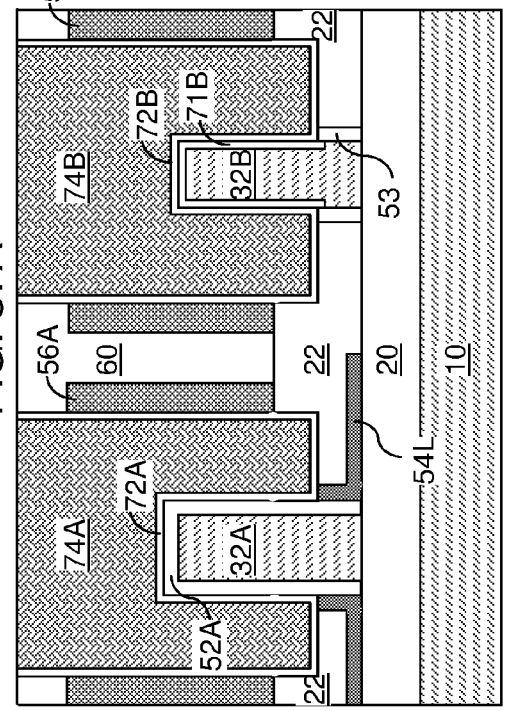
FIG. 37B is a vertical cross-sectional view of the variation of the fourth exemplary semiconductor structure along the vertical plane B-B' in FIG. 37A.

Referring to FIGS. 36A-36C, a variation of the fourth exemplary semiconductor is illustrated, which is derived from the fourth exemplary semiconductor structure of FIGS. 27A-27C by removing a portion of the high-k dielectric liner 54L around the second semiconductor material portion (32B, 34B, 36B) employing a masked etch. For example, a patterned mask layer (such as a patterned photoresist layer, not shown in drawings) can be formed over the fourth exemplary semiconductor structure of FIGS. 27A-27C such that the patterned mask layer protects a portion of the high-k dielectric liner 54L around the first semiconductor material portion (32A, 34A, 36A), while a portion of the high-k dielectric liner 54L around the second semiconductor material portion (32B, 34B, 36B) is not covered by the patterned mask layer. An etch process can be employed to remove the portion of the high-k dielectric liner 54L around the second semiconductor material portion (32B, 34B, 36B). The patterned mask layer can be subsequently removed. A remaining portion of the high-k dielectric liner 54L above the second semiconductor material portion (32B, 34B, 36B) can be substantially the same as the second high-k dielectric pad portion 44B. The remaining processing steps of the third embodiment can be subsequently performed. A resulting semiconductor structure is illustrated in FIGS. 37A-37C.

The various semiconductor structures of the present disclosure provide gate electrodes (74A, 74B) that vertically protrude downward below a horizontal plane including the topmost surface of the shallow trench isolation layer, and a corresponding increase in the channel width in fin field effect transistors, while providing a semiconductor-oxide-containing gate dielectric 52A that is protected from the chemistry of the anisotropic etch that vertically extends gate cavities (59A, 59B). Because the semiconductor-oxide-containing gate dielectric 52A is protected from the anisotropic etch that extends the gate cavities (59A, 59B), the semiconductor-oxide-containing gate dielectric 52A can contain lesser defects and greater reliability than a semiconductor-oxide-containing gate dielectric that is exposed to an etch chemistry of an anisotropic etch.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure, said method comprising:
   forming a semiconductor fin on a substrate;
   forming a semiconductor-oxide-containing gate dielectric on at least a portion of sidewalls of said semiconductor fin;
   forming a high dielectric constant dielectric liner having a dielectric constant greater than 8.0 directly on at least sidewalls of said semiconductor-oxide-containing gate dielectric;
   forming a shallow trench isolation layer, wherein a top surface of said shallow trench isolation layer is formed between a top surface and a bottom surface of said semiconductor fin;
   recessing said shallow trench isolation layer employing at least said high dielectric constant dielectric liner as an etch mask;
   physically exposing sidewalls of said semiconductor-oxide-containing gate dielectric by removing at least an upper portion of said high dielectric constant dielectric liner; and
   forming a high dielectric constant gate dielectric having a dielectric constant greater than 8.0 directly on said sidewalls of said semiconductor-oxide-containing gate dielectric.

2. The method of claim 1, further comprising:
   forming a disposable gate structure straddling said semiconductor fin;
   forming a planarization dielectric layer laterally surrounding said semiconductor fin and said disposable gate structure; and
   forming a gate cavity by removing said disposable gate structure selective to said planarization dielectric layer.

3. The method of claim 2, wherein said semiconductor-oxide-containing gate dielectric is formed after formation of said shallow trench isolation layer.

4. The method of claim 3, wherein said high dielectric constant dielectric liner is formed by deposition and an anisotropic etch of a dielectric material after formation of said gate cavity.

5. The method of claim 3, wherein said high dielectric constant dielectric liner is formed by deposition and anisotropic etch of a dielectric material prior to formation of said disposable gate structure.

6. The method of claim 1, wherein said semiconductor-oxide-containing gate dielectric is formed prior to formation of said shallow trench isolation layer.

7. The method of claim 6, wherein said high dielectric constant dielectric liner is formed by deposition and an anisotropic etch of a dielectric material prior to formation of said disposable gate structure.

8. The method of claim 6, wherein said high dielectric constant dielectric liner is formed by deposition of a dielectric material on a top surface of said substrate, wherein said shallow trench isolation layer is formed directly on a horizontal surface of a portion of said high dielectric constant dielectric liner in contact with said top surface of said substrate.

9. The method of claim 1, further comprising:
   forming another semiconductor fin on said substrate;
   forming another semiconductor-oxide-containing gate dielectric on at least a portion of sidewalls of said another semiconductor fin;
   removing said another semiconductor-oxide-containing gate dielectric after removing said upper portion of said high dielectric constant dielectric liner; and
   forming another high dielectric constant gate dielectric having a same composition as said high dielectric constant gate dielectric on sidewalls of said another semiconductor fin.

10. The method of claim 9, further comprising:
    forming another high dielectric constant dielectric liner directly on sidewalls of said another semiconductor-oxide-containing gate dielectric concurrently with formation of said high dielectric constant dielectric liner; and
    removing at least an upper portion of said another high dielectric constant dielectric liner concurrently with removal of said upper portion of said high dielectric constant dielectric liner.

11. The method of claim 1, wherein said forming said semiconductor-oxide-containing gate dielectric comprises thermal conversion and/or plasma conversion.

12. The method of claim 1, wherein said forming said semiconductor-oxide-containing gate dielectric comprises forming a semiconductor-oxide-containing gate dielectric material by chemical vapor deposition or atomic layer deposition, and etching said semiconductor-oxide-containing gate dielectric material.

13. The method of claim 1, wherein said forming said semiconductor-oxide-containing gate dielectric comprises a combination of thermal and/or plasma conversion and a deposition method.

14. The method of claim 1, wherein said semiconductor-oxide-containing gate dielectric comprises a semiconductor oxide or semiconductor oxynitride.

15. The method of claim 1, further comprising forming a chemical oxide layer on said sidewalls prior to forming said high dielectric constant dielectric.

16. The method of claim 1, further comprising forming at least one conductive material on said high dielectric constant gate dielectric.

17. The method of claim 16, wherein said at least one conductive material includes a work function metallic material and conductive fill material.

* * * * *